US012587191B2

(12) United States Patent
Morgan et al.

(10) Patent No.: US 12,587,191 B2
(45) Date of Patent: Mar. 24, 2026

(54) MULTICHANNEL DRIVER CIRCUITRY AND OPERATION

(71) Applicant: Cirrus Logic International Semiconductor Ltd., Edinburgh (GB)

(72) Inventors: Ross C. Morgan, Edinburgh (GB); Joe Walker, Edinburgh (GB); Yongjie Cheng, Austin, TX (US); Lingli Zhang, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 0 days.

(21) Appl. No.: 18/810,168

(22) Filed: Aug. 20, 2024

(65) Prior Publication Data

US 2024/0413822 A1      Dec. 12, 2024

Related U.S. Application Data

(63) Continuation of application No. 18/188,067, filed on Mar. 22, 2023, now Pat. No. 12,101,085.

(51) Int. Cl.
| | |
|---|---|
| *H03K 17/693* | (2006.01) |
| *H03K 3/017* | (2006.01) |
| *H03K 17/687* | (2006.01) |

(52) U.S. Cl.
CPC .......... *H03K 17/693* (2013.01); *H03K 3/017* (2013.01); *H03K 17/6871* (2013.01)

(58) Field of Classification Search
CPC .................................................. H03K 17/693

USPC .......................................................... 327/108
See application file for complete search history.

(56) References Cited

U.S. PATENT DOCUMENTS

| | | | | |
|---|---|---|---|---|
| 2008/0315955 A1* | 12/2008 | Delano | ................. | H03F 3/3081 |
| | | | | 330/297 |
| 2022/0376618 A1 | 11/2022 | Cheng | | |

OTHER PUBLICATIONS

Combined Search and Examination Report under Sections 17 and 18(3), UKIPO, Application No. GB2400275.0, dated Dec. 18, 2024.

* cited by examiner

*Primary Examiner* — Tomi Skibinski
(74) *Attorney, Agent, or Firm* — Jackson Walker L.L.P.

(57) ABSTRACT

This application relates to methods and apparatus for multichannel drivers for driving transducers in different channels. A multichannel driver has a plurality of output stages configured such that two output nodes can be modulated between selected switching voltages with a controlled duty cycle to generate a differential output signal across a respective transducer, each output stage being operable with different switching voltages in different modes of operation. A first set of two or more of the output stages are arranged to receive a voltage output by a capacitive voltage generator to use as a switching voltage. A controller is configured to control the mode of operation and duty-cycle of each of the output stages based on a respective input signal and also based on operation of the other output stages of the first set.

20 Claims, 7 Drawing Sheets

MULTICHANNEL DRIVER CIRCUITRY AND OPERATION

The present disclosure is a continuation of U.S. Non-Provisional patent application Ser. No. 18/188,067, filed Mar. 22, 2023, which is incorporated by reference herein in its entirety.

TECHNICAL FIELD

The field of representative embodiments of this disclosure relates to methods, apparatus and/or implementations concerning or relating to driver circuits, and in particular to multichannel switching driver circuits as may be used to drive a plurality of transducers in respective transducers channels.

BACKGROUND

Many electronic devices include transducer driver circuitry for driving a transducer with a suitable driving signal, for instance for driving an audio output transducer of the host device or a connected accessory, with an audio driving signal. In some applications, the transducer driving circuitry may be configured as multichannel driving circuitry to drive different transducers in multiple different channels, e.g. to provide multi-channel audio, such as stereo audio.

In some applications, the driver circuitry may include, for each channel, a switching amplifier stage, e.g. a class-D amplifier output stage or the like, for generating the relevant output drive signal for that channel. Switching amplifier stages, sometimes referred to as switched-mode amplifiers, can be relatively power efficient and thus can be advantageously used in some applications. A switching amplifier stage generally operates to switch an output node between high-side and low-side switching voltages, with a duty cycle that provides the required output voltage, on average over the course of the switching cycle, for the drive signal.

A switching driver may be arranged to drive the load, e.g. a transducer, of an individual channel in a single-ended configuration, in which the driver generates a modulated drive signal at a driver output node to drive one side of the relevant load, whilst the other side of the load is held at a fixed DC voltage, which may, for instance be a midpoint voltage of the output range of the switching driver. Alternatively, in some cases a switching driver may be arranged to drive the load of a channel in a bridge-tied-load configuration, where each side of the relevant load is driven, via a respective driver output node, with a modulated drive signal to generate a desired voltage difference across the load.

In either case, each driver output node for a given channel may conventionally be switched between fixed switching voltages, e.g. defined high-side and low-side voltages that do not substantially vary in use. In which case, the high-side and low-side voltages will be set to provide a desired output range at each driver output node.

In at least some applications it may be desirable to generate drive signals with relatively high amplitudes. This may, therefore, typically require the voltage difference between the defined high-side and low-side voltages to be relatively high to provide the required output range. For instance, in some audio applications there can be a desire to generate audio driving signals with a relatively high output power. Additionally or alternatively, piezoelectric or piezo transducers or ceramic transducers are increasingly being proposed for use in some applications, especially for portable electronics devices such as mobile telephones, laptop and tablet computers and the like, due to their thin form factor, and such transducers may require relatively high driving voltages, say of the order of tens of volts or so.

Using high driving voltages can, however, result in relatively large voltages stresses across the components, e.g. switches, of the driver circuitry, which may require the use of devices with high voltage tolerances, which may not be practical for some applications and/or which may add to the cost of the circuitry.

Also, in this case the output node will be switched, in each switching cycle, between the high-side and low-side voltages which define the full output range of the driver circuit. As will be understood by one skilled in the art, the variation in voltage at the output node over the switching cycle can impact load current ripple and the amount of EMI (electromagnetic interference) generated in use, which it may be beneficial to minimise.

In some instances, therefore, it may be advantageous to implement each switching driver as a multi-level switching driver, where the switching voltages that the output node is switched between may be varied in use. This requires that various different switching voltages are available for use for each of the output stages for each channel of the multichannel driving circuit.

SUMMARY

Embodiments of the present disclosure thus relate to improved multi-channel driving circuits.

According to an aspect of the disclosure there is provided a multichannel driver apparatus for driving a plurality of transducers in different channels based on respective input signals, comprising a plurality of output stages, each output stage comprising first and second driver output nodes for connection to opposite sides of a respective one of the plurality of transducers. Each output stage is configured such that each of the first and second driver output nodes can be modulated between selected switching voltages with a controlled duty cycle so as to generate a differential output signal across the load, and each output stage is operable in a plurality of different modes of operation in which the switching voltages are different in the different modes. The multichannel driver apparatus also comprises a first capacitive voltage generator for outputting a first generated voltage, wherein the first capacitive voltage generator is configured such that a first set of two or more of said plurality of output stages can receive the first generated voltage output by the first capacitive voltage generator to use as a switching voltage. A controller is configured to control the mode of operation and duty-cycle of each of the plurality of output stages based on a respective input signal, and the controller is configured to further control the mode of operation and/or duty-cycle of each of the output stages of the first set based on operation of the other output stages of the first set.

In some examples, the controller may be configured to control the mode of operation of each of the output stages of the first set so as to limit the number of output stages that use the first generated voltage output by the first capacitive voltage generator as a switching voltage at the same time.

In some examples, each of the output stages of the first set may be operable in at least first and second modes for a defined range of magnitude of the input signal for that output stage, wherein the first mode uses the first generated voltage output by the first capacitive voltage generator as a switching voltage and the second mode does not use the first generated voltage output by the first capacitive voltage generator as a switching voltage. The controller may be configured such that if the respective input signals for two or more output stages of the first set have magnitudes in the defined range, the controller controls at least one of said two or more output stages to operate in said second mode. If the respective input signals for two output stages of the first set have magnitudes in the defined range, the controller may control at least one of said two or more output stages to operate in the first mode and the other of said two or more output stages to operate in the second mode. The multichannel driver apparatus may further comprise at least one further capacitive voltage generator for outputting a second generated voltage, different to the first generated voltage. In some implementations, each of the output stages of the first set may be configured to use the second generated voltage from one of the at least one further capacitive voltage generators as a switching voltage in said second mode. The at least one further capacitive voltage generator may comprise a second capacitive voltage generator. A second set of two or more of the plurality of output stage may be configured to receive the second generated voltage from the second capacitive voltage generator for use as a switching voltage and the controller may be further configured to control the mode of operation of each of the output stages of the second set so as to limit the number of output stages that use the second generated voltage output by the second capacitive voltage generator as a switching voltage at the same time. In some examples, the first set of output stages and the second set of output stages may be the same as one another.

In some examples, the first capacitive voltage generator may comprise a first charge pump with connections for at least one hold capacitor to maintain the first generated voltage at an output of the first charge pump throughout a switching cycle of the first charge pump.

In some examples, the first capacitive voltage generator may comprise a first flying capacitor driver which is operable in switching cycle of different switch states, in which the first generated voltage is only present at an output of the first flying capacitor driver for part of the switching cycle with a controlled duty-cycle. In which case, the controller may be configured to control the mode of operation of each output stage in one or more preferred modes based on a magnitude of the input signal for that output stage, wherein at least one of the preferred modes uses the first generated voltage as a switching voltage. In the event that only a first one of the first set of output stages has an input signal with a magnitude that leads to a preferred mode that uses the first generated voltage as a switching voltage, the controller may be configured to operate that first output stage in that preferred mode and to control the first flying capacitor driver with a duty-cycle determined for modulating the relevant driver output node of that first output stage. In the event that at least first and second ones of the first set of output stages have an input signal with a magnitude that leads to a preferred mode that uses the first generated voltage as a switching voltage, the controller may be configured to: determine one of those at least first and second output stages as a dominant output stage and each of the rest of those at least first and second output stage as a non-dominant output stage based on their respective duty-cycle demand; operate the dominant output stage in the relevant preferred mode and control the first flying capacitor driver with a duty-cycle determined for modulating the relevant driver output node of that dominant output stage; and operate each non-dominant output stage in its preferred mode if possible, with controlled switching of that non-dominant output stage to maintain the correct duty cycle demand, or to operate the non-dominant output stage in an alternative mode with an adjusted duty-cycle. Over the course of a switching cycle of the first flying capacitor driver, the output of the first flying capacitor driver may be modulated between the first generated voltage and a different voltage, wherein the first generated voltage and said different voltage provide the switching voltages for a driver output node in at least one mode of operation of an output stage. The different voltage may be a first supply voltage received by the multichannel driver apparatus. The controller may be configured such that: for each output stage of the first set, for a magnitude of the relevant input signal in at least one defined range, the output stage is operable in at least a first mode in which one of the driver output nodes is modulated between the first generated voltage and the first supply voltage; and in the event that two or more output stages of the first set have input signal magnitudes that could lead to operation in a mode in which one of the driver output nodes is modulated between the first generated voltage and the first supply voltage, the controller: determines which of such output stages has a duty-cycle demand that requires the first generated voltage for the greatest proportion of the switching cycle as a dominant output stage; controls the duty-cycle of the first flying capacitor driver to match the duty-cycle demand of the dominant output stage; and controls each non-dominant output stage to connect the relevant driver output node to the output of the first flying capacitor driver for only part of the switching cycle and to separately connect that driver output node to the first supply voltage for the rest of the switching cycle to provide the required duty-cycle for that output stage.

The multichannel driver apparatus may, in some examples, further comprise a second flying capacitor driver which is operable, together with the first flying capacitor driver, to generate a second generated voltage, different to the first generated voltage, such that the first and second flying capacitor drivers can be operated together to modulate a common output node of the first and second flying capacitor drivers between the first and second generated voltages with a controlled duty cycle. The first set of output stages may be configured to receive the second generated voltage and are operable in at least one mode in which one of the driver output nodes is modulated between the first and second generated voltages. The controller may be configured such that: in the event that a first one of the first set of output stages has a magnitude of input signal that leads to operation in a mode in which one of the driver output nodes is modulated between the first and second generated voltages and a second one of the first set of output stages has a magnitude of input signal that leads to operation in a mode in which one of the driver output nodes is modulated between the first generated voltages and ground, the controller: determines the first output stage as the dominant output stage; controls the first and second flying capacitor drivers together to provide the required duty-cycle for the dominant output stage; controls the dominant output stage to connect the relevant driver output node to the common output node of the first and second flying capacitor drivers; and either operates the second output stage in the mode in which the relevant driver output node is modulated between the first generated voltage and the first supply voltage with timing control to connect the relevant driver output node to the common output node of the first and second flying capacitor drivers during a sufficient period when that common output node is at the first generated voltage; or operates the second output stage in an alternative mode in which the relevant driver output node is modulated between the second generated voltage and the first supply voltage with an adjusted duty-cycle.

In some examples, the controller may be configured such that: in the event that both first and second ones of the first set of output stages have a magnitude of input signal that leads to operation in a mode in which one of the driver output nodes is modulated between the first and second generated voltages, the controller: determines which of the first and second output stages has a duty-cycle demand that requires the second generated voltage for the greatest proportion of the switching cycle as a dominant output stage; controls the first and second flying capacitor drivers together to provide the required duty-cycle for the dominant output stage; controls the dominant output stage to connect the relevant driver output node to the common output node of the first and second flying capacitor drivers; and connects the relevant driver output node of the non-dominant stage to the common output node of the first and second flying capacitor drivers and controllably varies at least one of a duty-cycle of modulation of the other driver output node and the switching voltage used for the other driver output node to ensure a correct differential output across the load.

In some examples, the multichannel driver apparatus may comprise first and second input nodes for receiving first and second supply voltages defining an input voltage and at least one second capacitive voltage generator for generating a second generated voltage. Each of the first and second generated voltages and the first and second supply voltages may be different from one another, and the first and second generated voltages may be equal to the first and second supply voltages respectively boosted positively or negatively by an amount equal to the input voltage. Each of the output stages in the first set may be able to receive each of the first supply voltage, the second supply voltage, the first generated voltage and the second generated voltage to use a switching voltage and may be operable in at least: a mode 1 in which both the first and second driver output nodes are modulated between the first and second supply voltages; a mode 2a in which the one of first and second driver output nodes is modulated between the first generated voltage and the first supply voltage and the other of the first and second driver output nodes is modulated between the first and second supply voltages; a mode 2b in which the one of first and second driver output nodes is modulated between the first and second supply voltages and the other of the first and second driver output nodes is modulated between the second supply voltage and the second generated voltage; a mode 3a in which the one of first and second driver output nodes is modulated between the first generated voltage and the first supply voltage and the other of the first and second driver output nodes is modulated between the second supply voltage and the second generated voltage. The controller may be configured to operate an output stage in one of mode 2a or mode 2b when the input signal for that output stage has a magnitude within a defined range and wherein the controller is configured such that when two or more output stages have an input signal magnitude in the defined range at least one of those output stages is operated in mode 2b.

In another aspect there is provided a multichannel driver apparatus for driving a plurality of loads based on respective input signal comprising first and second supply nodes for connection to first and second supply voltages defining an input voltage, a plurality of capacitive voltage generators for generating at least first and second generated voltages that are different from the first and second supply voltages and which differ from the first and second supply voltages respectively by an amount equal to the input voltage and a plurality of output stages, each output stage having first and second driver output nodes for connection to opposite sides of a respective one of the plurality of loads. Each output stage is configured such that each of the first and driver output second nodes can be modulated between selected switching voltages with a controlled duty cycle so as to generate a differential output signal across the load and each output stage is configured to be able to receive each of the first supply voltage, the second supply voltage, the first generated voltage and the second generated voltage for use as a switching voltage. A controller is configured to control a mode of operation and the duty cycle of each of the plurality of output stages based on a respective input signal, wherein the switching voltages are different in different modes of operation; and wherein a first set of two or more of the plurality of output stages are configured to each receive the first generated voltage from the same capacitive voltage generator.

In a further aspect there is provided a multichannel driver apparatus for driving a plurality of transducers in different channels based on respective input signals, comprising: a plurality of output stages, each output stage comprising first and second driver output nodes for connection to opposite sides of a respective one of the plurality of transducers, wherein each output stage is configured such that each of the first and second driver output nodes can be modulated between selected switching voltages with a controlled duty cycle so as to generate a differential output signal across the respective transducer, and wherein each output stage is operable in a plurality of different modes of operation in which the switching voltages are different in the different modes; and at least one shared capacitive voltage generator for outputting a generated voltage for use as a switching voltage by a first set of two or more of said plurality of output stages; and a controller configured to control each of the plurality of output stages based on a respective input signal, wherein the controller is configured such the mode of operation and/or duty-cycle of an output stage of the first set for at least some magnitudes of input signal can vary depending on the operation of the other output stages of the first set.

In a further aspect there is provided a multichannel driver apparatus for driving a plurality of transducers in different channels based on respective input signals, comprising: a plurality of output stages, each output stage comprising at least one driver output node for connection to a respective one of the plurality of transducers, wherein each output stage is configured such that the at least one driver output nodes can be modulated between selected switching voltages with a controlled duty cycle, and wherein each output stage is operable in a plurality of different modes of operation in which the switching voltages are different in the different modes; and at least one shared voltage generator for outputting a generated voltage for use as a switching voltage by a first set of two or more of said plurality of output stages. In some examples the shared voltage generator may be a capacitive voltage generator. The at least one shared capacitive voltage generator may comprise a flying capacitor.

It should be noted that, unless expressly indicated to the contrary herein or otherwise clearly incompatible, then any feature described herein may be implemented in combination with any one or more other described features.

BRIEF DESCRIPTION OF DRAWINGS

For a better understanding of examples of the present disclosure, and to show more clearly how the examples may be carried into effect, reference will now be made, by way of example only, to the following drawings in which.

DESCRIPTION OF EMBODIMENTS

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Embodiments of the disclosure relate to multichannel driver circuitry for driving a plurality of transducers in different channels and to methods of operation of multichannel driver circuitry. Embodiments relate to multi-channel switching driver circuitry comprising a plurality of output stages, wherein each output stage comprises at least one driver output node that is, in use, modulated between selected switching voltages with a controlled duty-cycle so as generate a driving signal for driving the load transducer of that channel, i.e. each channel effectively comprises a switching amplifier. In at least some embodiments each output stage may comprises two driver output nodes, for connecting to opposite sides of the load, so as to drive the load in a bridge-tied-load (BTL) configuration. The switching voltages used for modulating the driver output node(s) can be selectively varied so as to be different in different operating modes. The switching voltages are generated to provide an overall output voltage range, but the switching voltages for a given driver output node in a given mode may differ by less than the full output voltage range, which can be beneficial in terms of limiting the voltage stresses across components of the driver circuitry and limiting EMI. The multichannel driver circuitry of embodiments of the disclosure comprises at least one capacitive voltage generator for generating one of the possible switching voltages which is shared between at least some of the output stages of the different channels.

Figure 1:
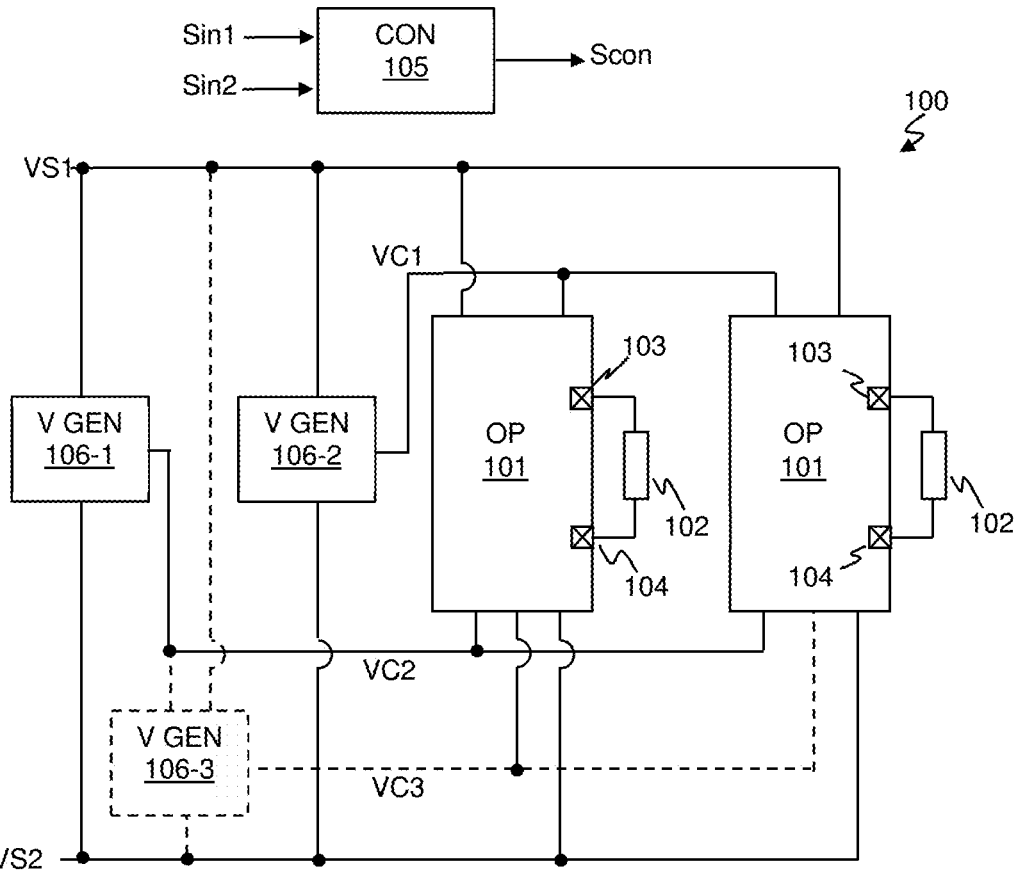
FIG. 1 illustrates generally a multichannel switching driver according to an embodiment.

FIG. 1 illustrates generally one example of a multichannel switching driver 100 according to an embodiment. FIG. 1 illustrates that the switching driver 100 has a plurality of output stages 101 for driving respective loads 102. FIG. 1 illustrates two output stages 101 but there could be more output stages for driving additional loads in some embodiments. In the example of FIG. 1, each output stage 101 is configured to drive its respective load 102 in a bridge-tied-load (BTL) configuration, i.e. to drive each side of the load with a respective modulated signal so as to generate a differential drive signal across the load based on a relevant input signal for that channel, e.g. Sin1 or Sin2. Thus, each output stage 101 has first and second driver output nodes 103 and 104 for connecting to opposite sides of the respective load. In use, the output stage 101 of a given channel is controlled, together with the rest of the switching driver 100, by a controller 105 so as to modulate each of the first and second driver output nodes 103 and 104 between two selected switching voltages so as to generate the differential output drive signal across the load based on the relevant input signal Sin1 or Sin2. Each output stage 101 is operable in a plurality of different modes and the switching voltages used for modulating the first and second output voltages are different in the different operating modes.

The switching driver 100 has input nodes for receiving first and second supply voltages, VS1 and VS2, which may, for example, be a positive supply voltage and ground. For the avoidance of doubt, as used in this disclosure the term supply voltage can include a ground voltage, i.e. 0V (zero volts) and references to receiving a supply voltage will cover receiving a defined ground voltage. The first and second supply voltages VS1 and VS2 define an input voltage Vin (as the difference between the first and second supply voltages VS1 and VS2, e.g. Vin=VS1−VS2).

The switching driver 100 comprises a plurality of capacitive voltage generators 106 for generating additional voltages, which are different to the first and second supply voltages VS1 and VS2, and which can be used as switching voltages for an output stage. In the example of FIG. 1, a first capacitive voltage generator 106-1 receives the first and second supply voltages and generates an output voltage VC1, which may for example correspond to the first supply voltage VS1 positively boosted by an amount equal to the input voltage Vin, and a second capacitive voltage generator 106-2 receives the first and second supply voltages and generates an output voltage VC2, which may for example correspond to the second supply voltage VS1 negatively boosted by an amount equal to the input voltage Vin. Optionally, there may be at least one capacitive voltage generator which receives at least one boosted voltage from one of the other capacitive voltage generators and which provides a further different boosted voltage, for example a third capacitive voltage generator 106-3 may receive the voltage VC2 generated by the second capacitive voltage generator 106-2 and generate a voltage VC3 which corresponds to the VC2 boosted negatively by an amount equal to the input voltage Vin.

It should be noted that whilst one or more capacitive voltage generators may be used for voltage boosting or step-up operation, i.e. to provide level shifting of a voltage to provide a voltage of a higher magnitude (whether positive boosting or negative boosting), in some applications at least one capacitive voltage generator may be configured to provide a voltage of a lower magnitude, e.g. to provide a buck or step-down operation which may provide a voltage with a magnitude which is a fraction of that of the input voltage. The examples below will be described in the context of boosted operation, but other embodiments may additionally or alternatively have at least capacitive voltage generator for step-down operation.

Each of the capacitive voltage generators 106 comprises, in use, at least one flying capacitor (not separately illustrated in FIG. 1) and a switch network such that the flying capacitor can be connected, in a charging state, to be charged to a defined voltage by the input voltages for that capacitive voltage generator, and which can then be connected, in an output state, with one of its input voltages to provide an output voltage which is level shifted from the input voltage.

In some cases, at least one of the capacitive voltage generators 106 may comprise a charge pump with, in use, at least one hold or reservoir capacitor (not illustrated) at the output of the charge pump to maintain the output voltage of the charge pump, i.e. so that the flying capacitor repeatedly charges the hold or reservoir capacitor which then provides the output voltage. As will be understood by one skilled in the art, the charge pump may be switched in a switching cycle that alternates between the charging and output states at a charge pump switching frequency so as to maintain the voltage of the hold capacitor at the charge pump output at the nominal output voltage, with only a relatively small amount of voltage ripple due to the switching operation of the charge pump. As used herein, the term charge pump shall be used to refer to a capacitive voltage generator that includes a hold or reservoir capacitor for maintaining the output voltage in a generally continuous manner when active, i.e. throughout the switching cycle of the charge pump.

In some embodiments, however, at least one of the capacitive voltage generators may not have a hold or reservoir capacitor at the output of the voltage generator, and thus the relevant output voltage of the charge pump may only be generated in the output switch state of the charge pump. As will be discussed in more detail below, such a capacitive voltage generator can be seen as a flying capacitor driver which can be connected to a driver output node of an output stage and the flying capacitor driver can be controlled to provide the voltage modulation of the output node.

In embodiments of the present disclosure, the switching driver 100 is configured such that at least one of the capacitive voltage generators 106 can be shared between at least some of the plurality of output stages 101, i.e. that the capacitive voltage generator 106 can be used to supply a voltage to a set of two or more of the plurality of output stages. FIG. 1 illustrates that the first and second capacitive voltage generators 106-1 and 106-2 are both shared with both of the output stages 101 and that the third capacitive voltage generator 106-3, if present, is also shared with both of the output stages 101. In some embodiments there could additionally be at least one capacitive voltage generator which is used to supply a voltage to just one output stage, i.e. which is not shared, and/or some capacitive voltage generators could be shared between different sets of output stages, as will be discussed in more detail below.

Each of the output stages 101 is provided with the first and second supply voltages VS1 and VS2 and can also be supplied with any of the generated voltages VC1 or VC2 (and/or, if present, VC3). The controller 105 is configured to control the output stage 101 for each channel to operate in a selected one of a plurality of different modes, wherein each mode corresponds to the output nodes of the output stage being modulated between different ones of these voltages.

The different modes can enable different magnitudes of output signal to be generated across the load. For instance, consider that the first and second supply voltages VS1 and VS2 are a positive supply voltage VP and ground, i.e. 0V, respectively and that the first and second capacitive voltage generators respectively boost the first and second supply voltages positively and negatively by an amount equal to the input voltage so that the voltages VC1 and VC2 are +2VP and −VP respectively. In this case, the possible switching voltages are +2VP, +VP, 0V or −VP.

An output stage 101 could be operated in a first mode, which can be seen as a low signal level mode, in which both driver output nodes of that output stage are modulated between the first and second supply voltages, VP and ground, to generate a differential output signal, of either polarity, with a magnitude of up to VP. The output stage could also be operated in a second mode, which can be seen as an intermediate signal level mode, in which a first driver output node (depending on the required polarity of the output signal) is modulated between the boosted voltage +2VP and the first supply voltage VP, whilst the second driver output node is modulated between the first and second supply voltages, VP and ground, to generate a differential output signal across the load of a magnitude up to 2VP. In an alternative second mode, the same output range could be generated by instead switching the first driver output node between the first and second supply voltages VP and ground, whilst switching the second output node between ground and the boosted voltage −VP. A third mode, which can be seen as a high signal level mode, may involve a first driver output node (depending on the required polarity of the output signal) being modulated between the boosted voltage +2VP and the first supply voltage VP, whilst the second driver output node is modulated between the ground and the boosted voltage −VP, to generate a differential output signal across the load of a magnitude up to 3VP.

It will be noted that the switching voltages are different in the different modes in that at least one of the switching voltages for at least one of the driver output nodes is different in each different mode. It will be understood that some switching voltages for the driver output nodes may be the same in different modes, e.g. the first and second mode in the example above both use VP and ground as switching voltage for one driver output node however the other node is switched between VP and ground in the first mode and between 2VP and VP in the second mode. As used herein a reference to different modes using different switching voltages shall thus mean that the set of switching voltages used in the different modes is not the same, but there may be some switching voltages in common in some cases.

The controller 105 is thus configured to control the mode of operation of each of the output stages 101 and a duty cycle of modulation of the driver output nodes in the relevant mode based on a suitable input signal for the relevant channel, e.g. Sin1 or Sin2. However, in embodiments of the present disclosure, as at least one of the capacitive voltage generators 106 is shared between multiple different output stages, the controller 105 also controls the modulation of an output stage based on the operation of the other output stage(s), e.g. the required modulation of the other output stage(s) based on its input signal.

Where a shared capacitive voltage generator 106 is a charge pump, the controller 105 may control the mode of operation of any output stages that can use the output of the charge pump as a switching voltage so as to limit or minimise the number of output stages that use the output voltage of that charge pump as a switching voltage during the same switching cycle. This can limit or minimise current draw from the charge pump when possible, so as to reduce conduction losses via a common conduction path.

Where a shared capacitive voltage generator 106 is a flying capacitor driver, the controller 105 may likewise be configured to try to limit or minimise the number of output stages that use the output of the flying capacitor driver at the same time. Additionally or alternatively, when two or more output stages do use the output of the flying capacitor driver in the same switching cycle, the controller may control the flying capacitor driver with a duty cycle which is appropriate for one of the output stages and, if necessary, to control the mode of operation and/or a duty-cycle of the other output stage(s) as necessary to ensure correct operation of those other output stages.

Further details and examples will be described with reference to the following embodiments.

Figure 2:
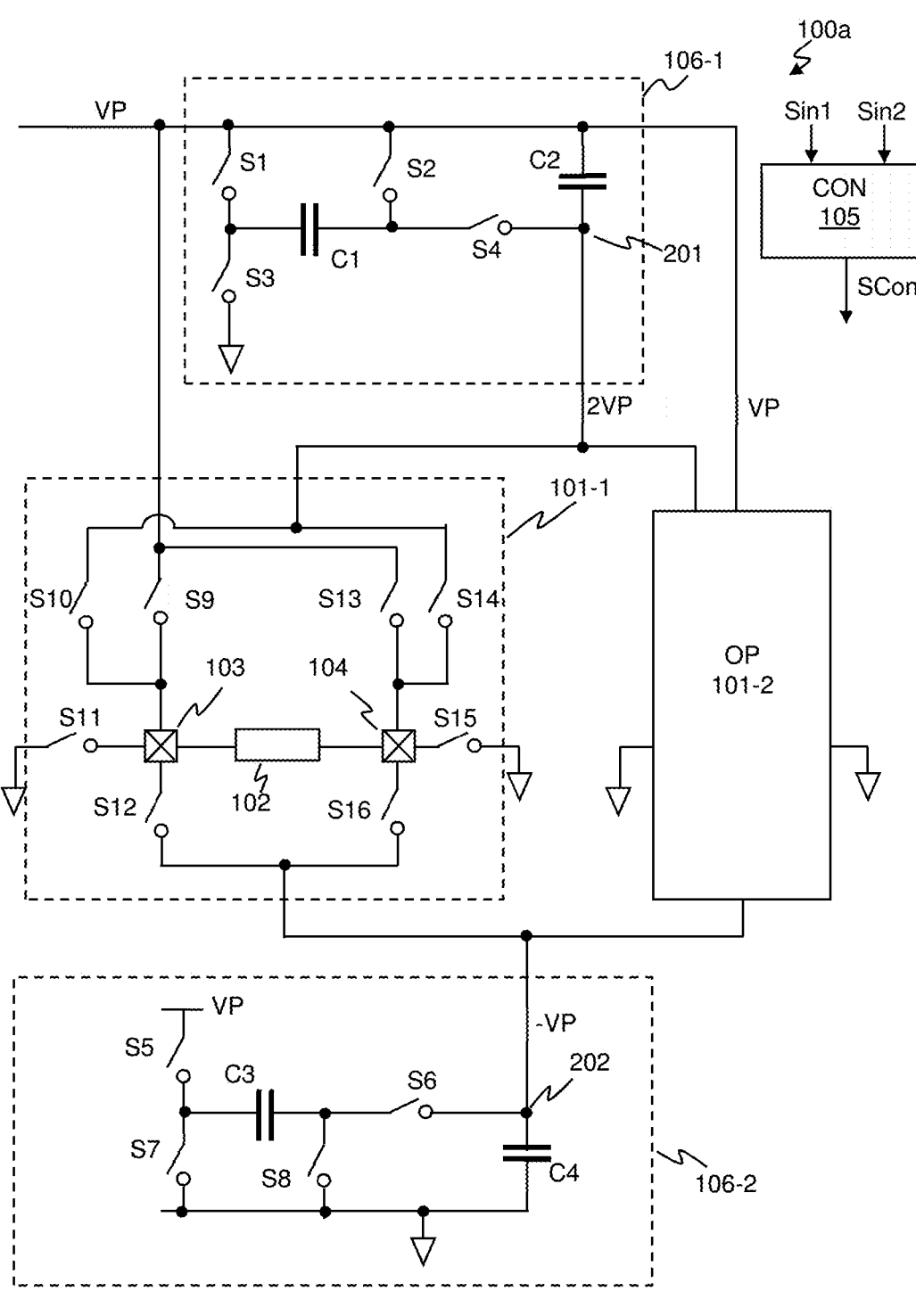
FIG. 2 illustrates one example of a multichannel switching driver with shared charge pumps.

FIG. 2 illustrates an embodiment of a switching driver 100, labelled as 100a, in which the capacitive voltage generators are charge pumps.

In the example of FIG. 2, the first and second supply voltages are a positive supply voltage VP and ground. The input voltage, Vin, in this example is thus equal to VP.

The switching driver 100a comprises a first capacitive voltage generator, which in this case is a first charge pump 106-1 which is configured, in use, to output a first generated voltage at a charge pump output node 201 which is different to the first and second supply voltages. As will be understood by one skilled in the art, a charge pump is a capacitor-based DC-DC converter for generating an output voltage with a defined relationship to the input voltage for the charge pump. In this example, the first charge pump 106-1 is arranged to positively boost the first supply voltage VP by an amount equal to the input voltage Vin=VP and so generates, in use, a first boosted output voltage of +2VP.

The first charge pump 106-1 comprises a flying capacitor C1 and a hold or reservoir capacitor C2. A switch network is configured so that the flying capacitor C1 can be selectively connected to be charged by the input voltage in a charging state, so the voltage across the capacitor becomes equal to input voltage, i.e. equal to VP, and then used in an output state to generate the voltage 2VP at the output node 201 of the charge pump. In this example, the charge pump switch network comprises four switches S1 to S4, with switches S1 and S3 selectively connecting a first electrode of the flying capacitor C1 to the first and second supply voltages respectively and switches S2 and S4 for selectively connecting the second electrode of the flying capacitor C1 to the first supply voltage or the charge pump output node 201 respectively. Switches S2 and S3 may be closed together (with S1 and S4 open) to provide the charging state and switches S1 and S4 may be closed (with S2 and S3 open) to provide the output state. The hold capacitor C2 is connected between the charge pump output node 201 and one of the first and second supply voltages. In the example of FIG. 2, the hold capacitor is connected between the first supply voltage VP and the charge pump output node 201 and thus, in use, the voltage across the hold capacitor C2 is also equal to the input voltage, in this example VP.

The switching driver 100a also comprises a second capacitive voltage generator, which is a second charge pump, labelled as 106-2, which is configured, in use, to provide a second generated voltage at a charge pump output node 202, where the second generated voltage is different to any of the first or second supply voltages or the first boosted voltage. In this example, the second charge pump 106-2 is arranged to negatively boost the second supply voltage, ground in this example, by an amount equal to the input voltage Vin=VP and so generates a second boosted output voltage of –VP. Note that as used herein, the term negatively boost in relation to operation shall mean that the output voltage generated by the charge pump is more negative/less positive than the relevant supply voltage (and likewise the term positively boost shall mean that the output voltage generated by the charge pump is more positive/less negative than the relevant supply voltage).

The second charge pump 106-2 also comprises a flying capacitor C3 and a hold or reservoir capacitor C4 and a network of switches, in this case four switches S5 to S8, where switches S5 and S7 selectively connect a first electrode of the flying capacitor C3 to the first or second supply voltages respectively and switches S6 and S8 selectively connect the second electrode of the flying capacitor C3 to the first supply voltage or the charge pump output node 202 respectively. Switches S5 and S8 may be closed together (with S6 and S7 open) to provide a charging state to charge the flying capacitor to the input voltage Vin=VP, and switches S7 and S6 may be closed (with S5 and S8 open) to provide an output state with a voltage-VP generated at the output node 202. The hold capacitor C4 is connected between the charge pump output node 202 and one of the first and second supply voltages. In the example of FIG. 2, the hold capacitor C4 is connected between the second supply voltage, ground, and the charge pump output node 202 and thus, in use, the voltage across the hold capacitor C4 is also equal to the input voltage, in this example VP.

The first and second charge pumps 106-1 and 106-2 in the example of FIG. 2 thus each comprise just four switches and two capacitors, and thus can be relatively small in area. It will be understood, however, that other designs of charge pump could be used in some applications. It will also be understood that, for any of the embodiments discussed herein, in some cases the capacitors could be formed as integrated components in an integrated circuit implementation but in some cases at least some of the capacitors may be external, i.e. off chip-components and the integrated circuitry may thus comprise connections for the relevant capacitors.

The switching driver 100a of FIG. 2 also comprises a plurality of output stages 101. In this example, two output stages are shown, a first output stage labelled 101-1 and a second output stage labelled 101-2, but it will be understood that there could be additional output stages in other examples. Note that the internal structure of the second input stage 101-2 is omitted for clarity but it may have basically the same internal structure as the first output stage 101-1.

The output stage 101 comprises a network of switches for selectively connecting each of the first and second driver output nodes 103 and 104 to any of the first supply voltage, the second supply voltage, the first boosted voltage output from the first charge pump 106-1 or the second boosted voltage output from the second charge pump 106-2.

In the example of FIG. 2, switches S9 and S10 are configured to selectively connect the first output node 103 to the first supply voltage VP or the first boosted voltage 2VP respectively. The first output node 103 can also be selectively connected to the second supply voltage, 0V, or to the second boosted voltage-VP by switches S11 and S12 respectively. Likewise the second output node 104 can be selectively connected to the first supply voltage VP by switch S13, to the first boosted voltage 2VP by switch S14, to the second supply voltage 0V by switch S15 or to the second supply voltage-VP by switch S16.

Thus, in the example of FIG. 2 each of the driver output nodes 103 and 104 can be selectively connected to any of the voltages of +VP, ground, +2VP or –VP. The switching driver 100a is able to generate a drive voltage across the load 102 with a maximum magnitude of 3VP, with one driver output node connected to 2VP and the other driver output node to –VP. Output voltages in the output range of +3VP to –3VP can be generated by switching the driver output nodes between selected switching voltages with appropriate duty-cycles. However, for any given switching cycle, the switching voltages that each driver output node is modulated between can differ from one another by an amount which is less than 3VP and, advantageously, each driver output node may, at any time, preferably be modulated between two switching voltages that differ from one another by VP, i.e. by an amount equal to the input voltage. The full output range from +3VP to –3VP can be achieved by operating the relevant output stage 101 of the switching driver 100a in different modes, depending on the level of the input signal Sin and hence the required output drive signal.

The output stages 101 are controlled by controller 105, to controllably switch the first and second driver output nodes 103 and 104 between selected switching voltages with controlled duty-cycles so as to generate a differential drive signal across the load (on average over the course of a switching cycle) based on the relevant input signal for that channel, e.g. Sin1 or Sin2. The controller 105 generates a set of controls signals Scon that control switching of the switches of each output stage 101 and, possibly, also the first and second charge pumps 106-1 and 106-2.

In one implementation each output stage may be operable in at least three main modes.

In a first mode of operation for an output stage 101, which may be considered as a low signal level mode of operation and which will be referred to herein as Mode 1, each of the first and second driver output nodes 103 and 104 may be switched between the same switching voltages as one another, which may conveniently be the first and second supply voltages, i.e. VP and 0V (ground) in this example. Thus, each of the first and second driver output nodes may be switched between VP and 0V, with an appropriate duty cycle, to generate an output voltage across the load in the range of +VP to −VP. In this mode of operation, switches S9 and S11 can be controlled in anti-phase with one another at an appropriate duty cycle for the first driver output node 103. Likewise switches S13 and S15 can be controlled in anti-phase with one another with an appropriate duty cycle for the second driver output node 104. Switches S10, S12, S14 and S16 are open throughout the switching cycle.

In another mode of operation for an output stage 101, which may be seen as an intermediate signal level mode of operation, and which will be referred to herein as Mode 2a, one of the first and second driver output nodes (depending on the required polarity of the output drive signal) may be modulated between the first boosted voltage 2VP and the first supply voltage VP, whilst the other driver output node is modulated between the first and second supply voltages VP and 0V. This intermediate signal level Mode 2a can produce an output voltage across the load of a magnitude up to 2VP.

For the purposes of discussion herein, any reference to a positive voltage across the load 102 will be taken as meaning that the voltage at the first driver output node 103 is more positive/less negative than the voltage at the second driver output node 104. Thus, for a positive output voltage in Mode 2a, switches S10 and S9 may be switched in anti-phase with one another with a controlled duty-cycle based on the desired output from the first driver output node 103 (with switches S11 and S12 open throughout the switching period). In this Mode 2a, for a positive output voltage across the load, the second driver output node 104 is switched between the voltages VP and 0V and thus switches S13 and S15 are controlled in anti-phase to one another with the required duty cycle (with switches S14 and S16 open throughout the switching cycle).

For a negative voltage across the load, the switching of the first and second driver output nodes 103 and 104 would be swapped, i.e. the second driver output node 104 would be modulated between 2VP and VP by controlling switches S14 and S13 with an appropriate duty cycle, whilst the first driver output node 103 switches between VP and 0V by duty-cycling switches S9 and S11. Thus, it can be seen that there are two sub-modes of Mode 2a, one for positive output voltages and one for negative output voltages.

The switching driver 100a may additionally be operable in a different intermediate signal level mode, which will be referred to herein as Mode 2b. In Mode 2b, one of the first and second driver output nodes (depending on the required polarity of the output drive signal) may be switched between the first and second supply voltages VP and 0V, whilst the other driver output node is switched between the second supply voltage 0V and the second boosted voltage −VP. Like Mode 2a, Mode 2b can produce an output voltage across the load of a magnitude up to 2VP.

To generate a positive voltage across the load, switches S9 and S11 could be switched in anti-phase with one another with a controlled duty cycle to modulate the first driver output node 103 between the voltage VP and ground, whilst switches S15 and S16 switched in anti-phase with one another with a controlled duty cycle to modulate the second driver output node 104 between the ground and the voltage-VP at the low-side rail. Switches S10, S12, S13 and S14 will be open throughout the switching cycle.

Again there may be positive and negative sub-modes of Mode 2b. Negative voltages across the load can be generated (in the negative sub-mode) by duty cycling switches S14 and S15 for the second output node 104, with switches S13 and S16 open throughout the switching cycle and duty cycling switches S11 and S12 for the first driver output node 103, with switches S9 and S10 open throughout the switching cycle.

In a further mode of operation, which can be seen as a high signal level mode of operation and which will be referred to herein as Mode 3, one of the first and second driver output nodes is switched between the first boosted voltage 2VP and the first supply voltage VP, whilst the other driver output node is switched between the second supply voltage 0V and the second boosted voltage −VP. This high signal level Mode 3 can produce an output voltage across the load of a magnitude up to 3VP.

In this mode of operation, for a positive output voltage, switches S10 and S9 may be switched in anti-phase with one another with a controlled duty-cycle based on the desired output from the first driver output node 103 (with switches S11 and S12 open throughout the duty-cycle). The second driver output node 104 is switched between 0V and −VP and thus switches S15 and S16 are controlled in anti-phase to one another with the required duty cycle (with switches S13 and S14 open throughout the switching cycle).

By switching appropriately between these modes, an output stage 101 of the switching driver 100a can thus provide an output voltage across its load in the range of +3VP to −3VP but in each switching cycle each driver output node is only switched between switching voltages that differ from one another by an amount equal to VP. This is beneficial in terms of reducing EMI compared to switching the output node by a voltage difference of 3VP as would otherwise be required to provide the same output range in a conventional switching amplifier with fixed switching voltages. This operation can also reduce the voltage stress across at least some of the switches in use, requiring a lower voltage standoff for the switches.

In some examples, the controller 105 may control the switching driver 100a such that an output stage 101 operates in the low signal level mode, Mode 1 for relevant input signal magnitudes up to a first threshold, with an appropriate duty cycle to provide the appropriate output voltage across the load. The first threshold may correspond to an output voltage magnitude at or below VP. For input signals with a magnitude above the first threshold, but below a second, higher threshold, the controller 105 may control the output stage 101 of switching driver 100 to operate in one of the intermediate signal level modes, Mode 2a or Mode 2b, with appropriate switching for the required polarity, i.e. with operation in the relevant positive or negative sub-mode. The second threshold may correspond to an output voltage magnitude at or below 2VP. For levels of input signal above the second threshold, the controller 105 may control the output stage 101 of the switching driver 100 to operate in the high signal level mode, i.e. Mode 3, with appropriate switching for the required polarity.

The mode of operation and duty cycle for each active channel of the switching driver 100a is controlled by the controller 105 based on the relevant input signal for that channel, e.g. Sin1 or Sin2. However, in embodiments of the disclosure, the mode of operation for each output stage may also be controlled based on the operation of another output stage. In particular, the modes of operation of two or more active output stages may be selected so that, where possible, an output stage which uses a boosted voltage output by one of the charge pumps as a switching voltage selectively uses a boosted voltage which is not also being used by another output stage at the same time (or which is being used by the fewest other active output stages).

For instance, for the first and second output stages 101-1 and 101-2 of the example of FIG. 2, the controller may control each of these output stages to operate in Mode 1 for a respective low-level input signal and in Mode 3 for a respective high-level input signal. However, for an intermediate-level input signal for the first channel the controller 105 may control the first output stage 101-1 to operate in one of the intermediate level modes, say Mode 2a, but for an intermediate-level input signal for the second channel the controller 105 may control the second output stage 101-2 to operate in the other of the intermediate level modes, say Mode 2b.

In this case, for the first channel, the output stage 101-1 doesn't use either of the boosted voltages 2VP or –VP output from the first and second charge pumps as a switching voltage when operating in the Mode 1 for low-level signals, uses just the first boosted voltage 2VP from the first charge pump 106-1 for a switching voltage for one driver output node in Mode 2a and uses both the first and second boosted voltages 2VP and –VP from the first and second charge pumps 106-1 and 106-2 in Mode 3. The second output stage 101-2 also doesn't use either of the boosted voltages in Mode 1 and uses both voltages (2VP and –VP) when operating in Mode 3 for high-level signals, however, in this case, for intermediate-level signals the second output stage 101-2 operates in Mode 2b and uses just the second boosted voltage-VP from the second charge pump 106-2. This can be advantageous in limiting conduction losses, e.g. $I^2R$, losses from the common conduction paths associated with the charge pumps in the case where both channels have intermediate signal levels.

If the input signal for the first channel is at an intermediate level, i.e. with a magnitude above the first threshold but below the second threshold, the first output stage 101-1 may thus be operated in the Mode 2a and use the first boosted voltage 2VP as a switching voltage. If the input signal for the second channel is also at an intermediate level, the second output stage 101-2 may be operated in Mode 2b and use the second boosted voltage-VP as a switching voltage. In this example the output voltages of each of the first and second charge pumps 106-1 and 106-2 is used by just one of the output stages only. Were instead, both output stages operated in the same intermediate signal level mode, say Mode 2a, then the boosted voltage 2VP output from the first charge pump 106-1 would be used by each of the output stages, which would lead to an increase current draw from this charge pump.

Given there is a shared, common, conduction path for both output stages from the each of the charge pumps, and that conduction losses scale as a factor of the square of the current, supplying all the required current for both output stages from just the first charge pump may lead to increased losses, compared to supplying the same overall current separately from the first and second charge pumps. For example, if the current demand for each output stage were the same and equal to $I_D$, then supplying the overall current $2I_D$ from just one of the charge pumps can lead to overall conduction losses of $4I_D^2R$ as opposed to overall conduction losses of $2I_D^2R$ when using the two separate charge pumps to each supply a current of $I_D$.

It will be understood that if the signal level for at least one of the channels is high, i.e. the magnitude is above the second threshold, and the relevant output stage is operating in Mode 3, then unless the signal level for the other channel is low, so that the other output stage is operating in Mode 1 and not using either of the charge pump boosted voltages as a switching voltage, then the output voltage of at least one of the first and second charge pumps 106-1 and 106-2 will be used as switching voltage for both output stages.

However, Mode 3 operation may only be required for the highest signal levels which may occur only infrequently, whereas instances of both channels being at an intermediate signal level may occur much more frequently. The power efficiency for operating in different intermediate signal level modes may thus be relatively significant.

It will also be understood that if more different switching voltages were available then there could be additional possible operating modes and the controller 105 may be configured to select between the possible modes for the relevant signal level to spread the current draw amongst the different charge pumps as far as possible to limit conduction losses.

For instance, consider that a third capacitive voltage generator 106-3 were present (as illustrated in FIG. 1) and was, for example, a charge pump capable of generating an output voltage of –2VP, for instance by charging a flying capacitor to a voltage of 2VP in a charge state using the first supply voltage VP and the boosted voltage –VP, and then negatively boosting the second supply voltage, ground, to provide an output voltage of –2VP in the output stage. If this third charge pump were also shared with both output stages, the output nodes could be operated in additional modes. In this case each output stage could be operated in each of Mode 1, Mode 2a, Mode 2b as discussed above, as well as an additional Mode 4, which could be used for signal magnitudes above a third, higher threshold, for generating output of a magnitude up to 4VP, by switching one driver output node between the first boosted voltage 2VP and the first supply voltage VP, whilst switching the other driver output node between the boosted output voltage –2VP from the third charge pump and the boosted voltage –VP output from the second charge pump.

Further, in addition to the Mode 3 operation discussed above (which will now be referred to as Mode 3a), there could be an additional mode, referred to as Mode 3b, for generating an output of a magnitude up to 3VP which could be used for signal levels above the second threshold, but below the third threshold. In Mode 3b, one driver output node could be switched between the first and second supply voltages VP and ground, whilst the other driver output node is modulated by the boosted output voltage –2VP from the third charge pump and the voltage –VP from the second charge pump. In this case the controller 105 could control one of the output stages to preferably operate in Mode 3b, which doesn't use the output voltage 2VP of the first charge pump, rather than Mode 3a, if the other output stage is operating in either of Mode 2a or Mode 3a, which does use the output voltage 2VP from the first charge pump as a switching voltage. In this case, the output stage operating in Mode 2a or Mode 3a will use the output 2VP of the first charge pump but won't use the output –2VP of the third charge pump, whereas the output stage operating in Mode 3b will use the output –2VP of the third charge pump but won't use the output 2VP of the first charge pump. If one output stage operates in Mode 3a and the other operates in Mode 3b, both output stages will, however, use the output –VP of second charge pump.

In some implementations there could, additionally or alternatively be a further additional mode, which will be referred to as Mode 3c, for generating an output of a magnitude up to 3VP which could be used for signal levels above the second threshold, but below the third threshold. In Mode 3c one of the driver output nodes is modulated between the first and second supply voltage VP and ground as switching voltages and the other driver node is modulated between the second supply voltage, i.e. ground, and the voltage –2VP output from the third charge pump. This Mode 3c thus uses just the output of the third charge pump, but it will be appreciated that one of the driver output nodes is modulated between switching voltages which differ from one another by an amount equal to 2VP, which could lead to a greater amount of EMI. The controller 105 could therefore be configured to preferably control the modes of operation of output stages to minimise the extent to which both output stages draw current from the same charge pump.

It will be understood that other modes of operation could be implemented by switching between different ones of the possible switching voltages and that in other applications there may be other arrangements of charge pumps and boosted voltages. The same principles also apply to charge pumps that provide level shifting of a voltage by an amount which is a fraction of the input voltage, e.g. a step-down functionality.

In general, therefore, the example of FIG. 2 illustrates that, in some embodiments, there may be at least one charge pump for generating an output voltage that can be used as a switching voltage by a plurality of output stages, where each of the plurality of output stages is operable in different modes, where the switching voltages used by the output stage varies in the different modes. A controller is configured to control the mode of operation of the different output stages to generally limit or reduce, where possible, the number of output stages which use the same charge pump output voltage as a switching voltage at the same time.

In some implementations at least one of the capacitive voltage generators for generating one of the switching voltages may, instead, be configured as a flying capacitive driver.

Figure 3A:
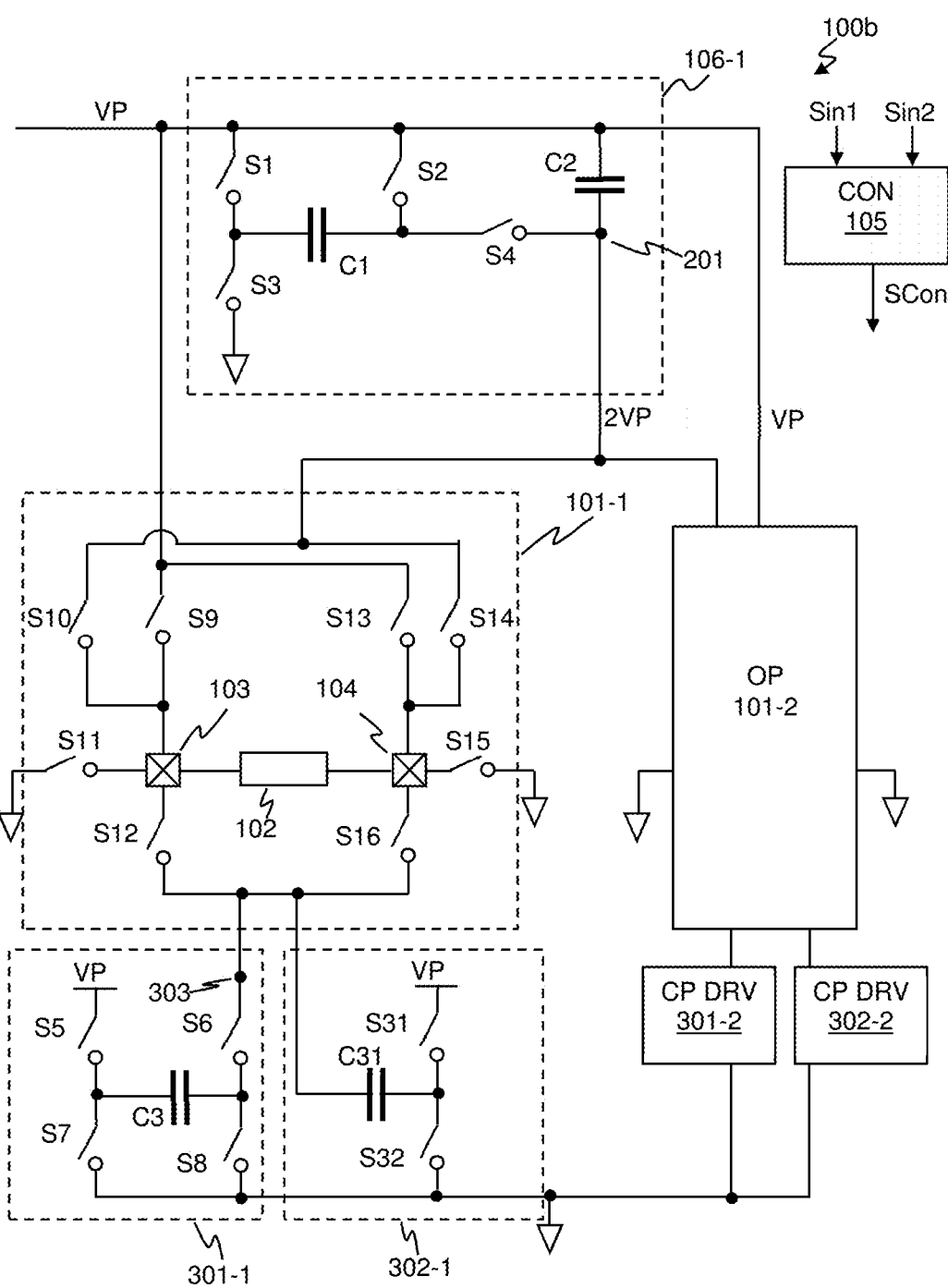
FIGS. 3a and 3b illustrate examples of multichannel switching drivers with a shared charge pump and with flying capacitor drivers.

FIG. 3a illustrates one example of a switching driver circuit that comprises flying capacitor drivers for generating at least some of the switching voltages and in which similar features to those discussed with reference to FIGS. 1 and 2 are identified by the same reference numerals.

The switching driver of FIG. 3a, labelled as 100b, again comprises a plurality of output stages 101, in this example first and second output stages 101-1 and 101-2. In this example each output stage has the same structure as discussed with reference to FIG. 2.

The switching driver 100b of FIG. 3a again receives first and second supply voltages, which in this example are a positive supply voltage VP and ground. The switching driver 100b also has a first capacitive voltage generator 106-1, which is a charge pump that receives the first and second supply voltages and generates a first boosted voltage nominally equal to 2VP.

The switching driver 100b also comprises a plurality of capacitive voltage generators configured as flying capacitor drivers. In the example of FIG. 3a, each output stage has respective first and second flying capacitor drivers 301 and 302 (labelled as 301-1 and 302-1 for the first output stage 101-1 and 301-2 and 302-2 for the second output stage 101-1). Only the internal structure of the first and second flying capacitor drivers 301-1 and 302-1 for the first output stage 101-1 is shown in FIG. 3a, but it will be understood that the first and second flying capacitor drivers 301-2 and 302-2 for the second output stage 101-2 may have the same configuration.

The first flying capacitor driver 301 is similar to the charge pump 106-2 discussed with reference to FIG. 2, and has a flying capacitor C3 and switch network of switches S5 to S6 so that the flying capacitor can be charged to the input voltage, i.e. to VP, in a charging state and then connected in an output stage to provide negative boosting of the second supply voltage, i.e. ground, to provide a boosted voltage of –VP at the output node 303 of the flying capacitor driver 303, which is connected to the low-side rail of the relevant output stage 101. However the flying capacitor driver 301 does not have a hold capacitor coupled to the flying capacitor driver output node 303 to maintain the output voltage. In other words, hold capacitor C4 from the charge pump 106-2 of FIG. 2 is omitted. Thus, the boosted output voltage –VP is only generated at the flying capacitor driver output node 303 in the output state, i.e. for only part of the switching cycle of the flying capacitor driver 301. In operation, if the first flying capacitor 301 is active (but the second flying capacitor driver 302 is not active), switch S6 of the first flying capacitor driver may be closed throughout the switching cycle and thus in the charging phase the output node 303 of the first capacitive driver will be driven to ground. Thus the first flying capacitor driver can be used to modulate the output node 303 between –VP and ground.

The second flying capacitor driver 302 also comprises a flying capacitor C31 and a switch network comprising, in this example, switches S31 and S32. The second flying capacitor driver 302 is coupled to the low side rail and is operable, together with the first flying capacitor driver 301, to generate an output voltage of –2VP. In a charging state for the second flying capacitor driver 302, the first flying capacitor driver 301 operates in its output state to provide the voltage of –VP to the low-side rail. Switch S31 is closed, with S32 open, to connect the flying capacitor C31 between the boosted voltage –VP at the low-side rail and the first supply voltage, so that the flying capacitor C31 is charged to a voltage of 2VP. In an output state for the second flying capacitor driver, switch S32 is closed, with S31 (and switch S6 of the first flying capacitor driver) open to negatively boost the second supply voltage, i.e. ground, to output at voltage of –2VP. When the second flying capacitor driver 302 is active, the output node 303 of the first flying capacitor driver, which can be seen as a common output node of the two flying capacitor drivers, is modulated between –2VP and –VP.

Flying capacitor drivers, such as the first and second flying capacitor drivers 301 and 302, can be used to provide the switching voltages, e.g. –VP and –2VP when required, but the relevant switching voltage is only generated for part of the switching cycle. This may be referred to as providing the relevant switching voltage in a discontinuous manner, as compared to a charge pump, which maintains the relevant output voltage throughout the switching cycle and which may therefore be referred to as providing the relevant switching voltage in an discontinuous manner. The terms "indirect-coupled" or "AC-coupled" may also be used to refer to the provision of switching voltages via a flying capacitor driver and the terms "direct-coupled" or "DC-coupled" may be used to refer to provision of switching voltages in a continuous manner via charge pump. Generating the switching voltage in a discontinuous manner can, for some applications, be relatively power efficient compared to use of a charge pump, and flying capacitor driver can be implemented without needing a hold or reservoir capacitor, which can, in some cases, reduce the bill of materials (BOM) and hence cost and/or area of the circuitry.

The switching driver 100b comprises a charge pump 106-1 for providing the voltage 2VP in a continuous manner and first and second flying capacitor drivers 301 and 302 for generating the voltage –VP and –2VP in a discontinuous manner and thus has a mix of direct-coupled and indirect-coupled voltage generation paths.

The switching driver 100b of FIG. 3a may be operable in all the same modes as discussed with reference to FIG. 2. However, in this example, when one or both of the first and second flying capacitor drivers are used to provide a switching voltage for an output stage, the relevant flying capacitor driver is switched between the charging and output stages with a controlled duty cycle appropriate for the required output signal.

Thus, each output stage 101 may be operable in a Mode 1 to generate output voltages with a magnitude of up to VP across the load 102 by modulating each of the first and second driver output nodes 103 and 104 between VP and ground as discussed with reference to FIG. 2, i.e. by switching switches S9 and S11 in antiphase with an appropriate duty-cycle for the first output node 103 and switching switches S13 and S15 in antiphase with an appropriate duty-cycle for the second output node 104. Likewise, each output stage 101 may be operable in Mode 2a to generate output voltages with a magnitude of up to 2VP across the load 102, by modulating one driver output node (depending on the polarity required for the output signal) between 2VP and VP whilst modulating the other driver output node between VP and ground. For a positive output voltage this may involve duty-cycling switches S10 and S9 for the first output node 103 and duty-cycling switches S13 and S15 for the second output node 104.

The switching driver is also operable in Mode 2b to generate output voltages with a magnitude of up to 2VP across the load 102, by modulating one driver output node (depending on polarity of the output signal) between VP and ground whilst modulating the other driver output node between ground and –VP. In this case, however, the first flying capacitor driver 301 is switched between its charging and output stages with a duty-cycle controlled by the controller 105 that is appropriate for the relevant driver output node. For example, for a positive output voltage, the first driver output node 103 may be duty-cycled between VP and ground by duty-cycling switches S9 and S11. The second driver output node 104 may be duty-cycled between 0V and –VP by keeping switch S16 closed throughout the switching cycle and duty-cycling switches S5 and S8 together in antiphase with switch S7. Switch S6 may also be kept closed throughout the switching cycle, so that in the charging state for the first capacitor driver 301, with switch S8 closed, the output node 303 of the flying capacitor driver, and hence also the second driver output node, is driven to ground.

Note, in this case, when the first flying capacitor driver 301 is being used to modulate the low-side rail between the boosted voltage-VP and ground, the second flying capacitor driver 302 is not used. In some cases switch S31 could be closed, at least in some switching cycles, when the flying capacitor driver 301 is in its output state and generating –VP at the low side rail so as to keep the flying capacitor C31 of the second flying capacitor driver 302 charged to –2VP. When the first flying capacitor driver 301 in its charging phase, and the low-side rail is connected to ground via switches S6 and S8, the other side of the flying capacitor C31 of the second flying capacitor driver 302 could be left floating at +2VP, although in some cases there could be an additional switch (not illustrated) to connect the flying capacitor C31 to the first boosted voltage 2VP from the charge pump 106-1 in this state so as to maintain control over the voltages.

In addition, the switching driver 100b may be operable in Mode 3a as discussed with reference to FIG. 2, to generate output voltages with a magnitude of up to 3VP across the load 102, by modulating one driver output node (depending on the polarity of the output signal) between 2VP and VP whilst modulating the other driver output node between ground and –VP. The alternative Mode 3b for generating output voltages with a magnitude of up to –3VP can also be implemented by driving one driver output node between VP and ground whilst modulating the other driver output node between –2VP and –VP. To modulate the relevant driver output node between –2VP and –VP, the relevant switch S12 or S16 could be closed throughout the switching cycle and the first and second flying capacitor drivers controlled together with a controlled duty-cycle to switch between the charging and output states for the second flying capacitor driver.

Note that when the second flying capacitor driver 302 is active, the first flying capacitor driver 301 can be seen as acting as part of the second flying capacitor driver 302. Thus, it can be seen that the first flying capacitor driver 301 can be selectively activated to provide a modulation between –VP and ground, or the second flying capacitor driver 302 can be selectively activated to provide a modulation between –2VP and –VP (but when the second flying capacitor driver 302 is activated, the circuitry of the first flying capacitor driver 301 acts as part of the second flying capacitor driver 302).

The switching driver 100b may also be operable in a Mode 4, to generate output voltages with a magnitude of up to 4VP across the load 102, by modulating one driver output node (depending on the polarity of the output signal) between 2VP and VP whilst modulating the other driver output node between –VP and –2VP. For example for a positive output voltage across the load 102, the first driver output node 103 may be modulated between 2VP and VP by duty-cycling the switches S10 and S9. The second driver output node 104 can be modulated between –VP and –2VP by keeping switch S16 closed throughout the switching cycle and controlling the first and second flying capacitor drivers 301 and 302 with an appropriate duty-cycle.

In the example of FIG. 3a, each output stage 101 has respective first and second flying capacitor drivers 301 and 302 that supply that output stage alone. However, the charge pump 106-1 is shared between the output stages. In at least some embodiments, the controller 105 may again be configured to control the output stages to minimise instances when multiple different output stages are using the voltage 2VP output from the charge pump 106-1 as a switching voltage at the same time.

The controller 105 may thus control the output stages to avoid an output stage operating in either Mode 2a or Mode 3a, which uses the first boosted voltage VP from charge pump 106-1 as a switching voltage, if the other output stage is operating in any of Mode 2a, Mode 3a or Mode 4, which would also involve using the first boosted voltage VP from charge pump 106-1 as a switching voltage. In the example of FIG. 3a, the controller 105 may be configured to not use Mode 2a and/or Mode 3a and just use the alternative modes, Mode 2b or Mode 3b as appropriate. However, it may, in some cases be preferable to use one of Mode 2a or Mode 3a for one of the output stages when possible, for at least certain signal levels, for example to limit duty-cycle dependence on output impedance that arises from use of a flying capacitor driver.

In the example of FIG. 3a, each of the output nodes 103 and 104 may be selectively and independently connected to any of the first supply voltage, the second supply voltage or the first boosted voltage, i.e. to VP, ground or 2VP, by respective switches (S9, S10 and S11 for the first output node). Each of the output nodes 103 and 104 may also be switched to receive either –VP or –2VP, but these voltages are received via the same switch, e.g. S12 for the first output node 103. Switch S12 can be seen as selectively connecting the first output node to a switching voltage node or rail, e.g. a low-side voltage rail, that can be switched to be either –VP or –2VP. This approach of receiving at least some of the possible switching voltages from a switching voltage node or rail could also be used for some of the other switching voltages, for instance for the high-side voltages VP and 2VP. This can have advantages in terms of efficient circuit layout in providing suitable connections for the output nodes 103 and 104.

Figure 3B:
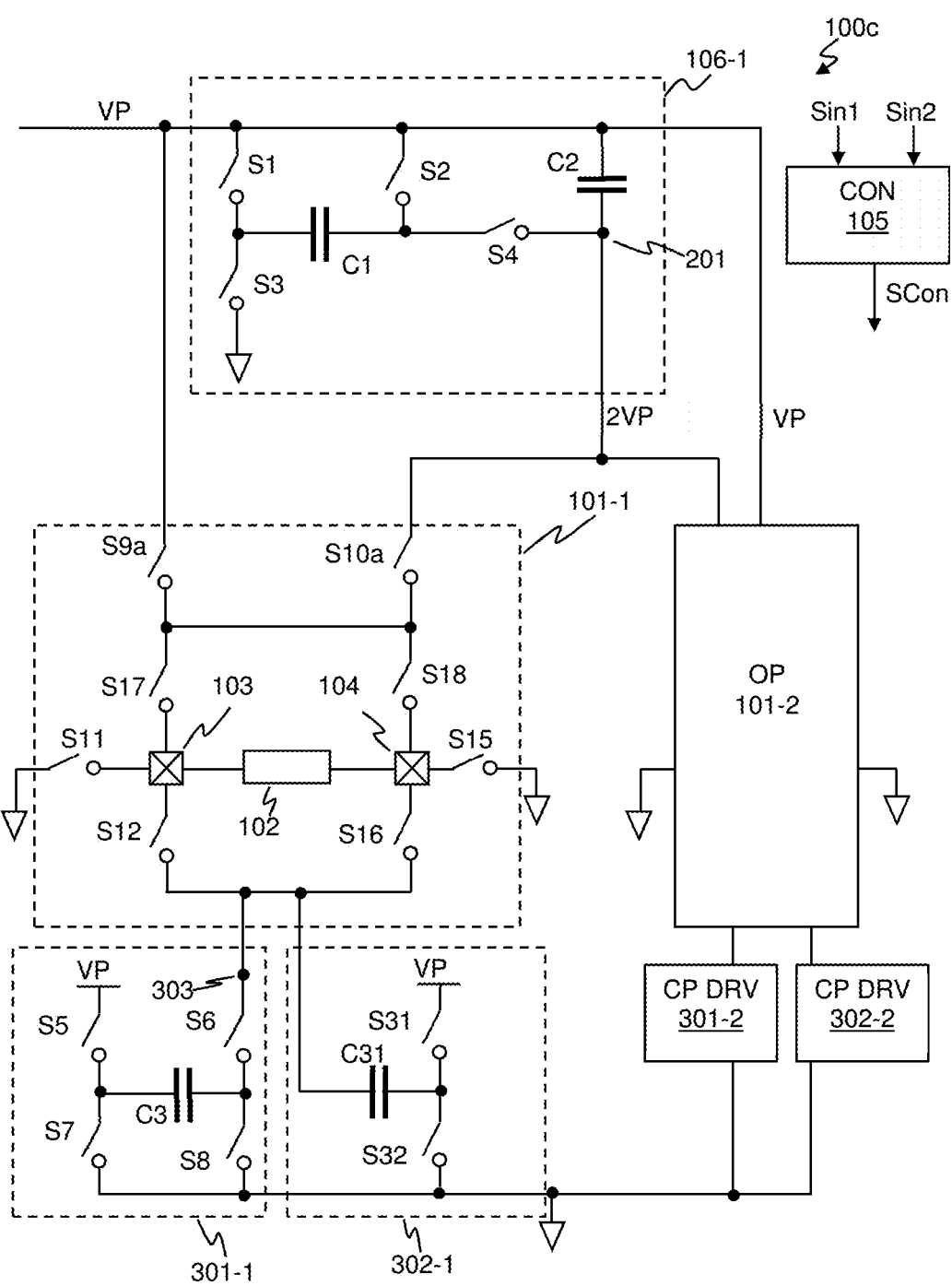

FIG. 3b illustrates another example of a switching driver, labelled as 100c, which is similar to that described with reference to FIG. 3a, but with a different switch arrangement for the output stage 101. Rather than each of the first and second output nodes 103 and 104 being independently connected to the first supply voltage VP and first boosted voltage 2VP via respective switches (S9, S10, S13 and S14 in FIG. 3a), in the example of FIG. 3b the first supply voltage VP and the first boosted voltage 2VP may each be selectively connected to what can be seen as a high-side rail by respective switches S9a and S10a. The first and second output nodes 103 and 104 may each be selectively coupled to the high-side rail by switches S17 and S18 respectively. The output stage 101 thus has the same number of switches as that illustrated in FIG. 3a, but there are fewer connections to each output node. Taking the first output node 103 as an example, this output node can be switched to VP by closing switches S9a and S17 together and can be switched to 2VP by closing switches S10a and S17 together.

Depending on the switching control employed, the output stage 101 described with reference to FIG. 3b may, in some cases, be operated in all of the same modes as discussed above with reference to FIG. 3a. However, for Mode 2a, where one output node switches between 2VP and VP and the other output node switches between VP and 0V, it would not be possible for each output node to be switched to its relevant high switching voltage (i.e. the most positive voltage) at the same time, as may be the case for some modulation schemes. Therefore, in some implementations, an output stage 101 such as illustrated in FIG. 3b may not be operable in Mode 2a, but it would be operable in any of Mode 1, Mode 2b, Mode 3a, Mode 3b or Mode 4 and the controller may thus control each output stage to selectively operate in Mode 3a or Mode 3b based on the operation of another output stage.

The other embodiments described herein may be implemented with an output stage such as illustrated in FIG. 3a or an output stage as illustrated in FIG. 3b, or some variant. In general an output node may be selectively connected, via a switch, to a voltage node which, in use, provides a fixed switching voltage, and/may be selectively connected, via a switch, to a voltage node or rail that can be controllably switched between different switching voltages.

The examples of FIGS. 3a and 3b have separate flying capacitive drivers for each of the output stages. In some embodiments, however, at least one flying capacitor driver may be shared between multiple output stages.

Figure 4:
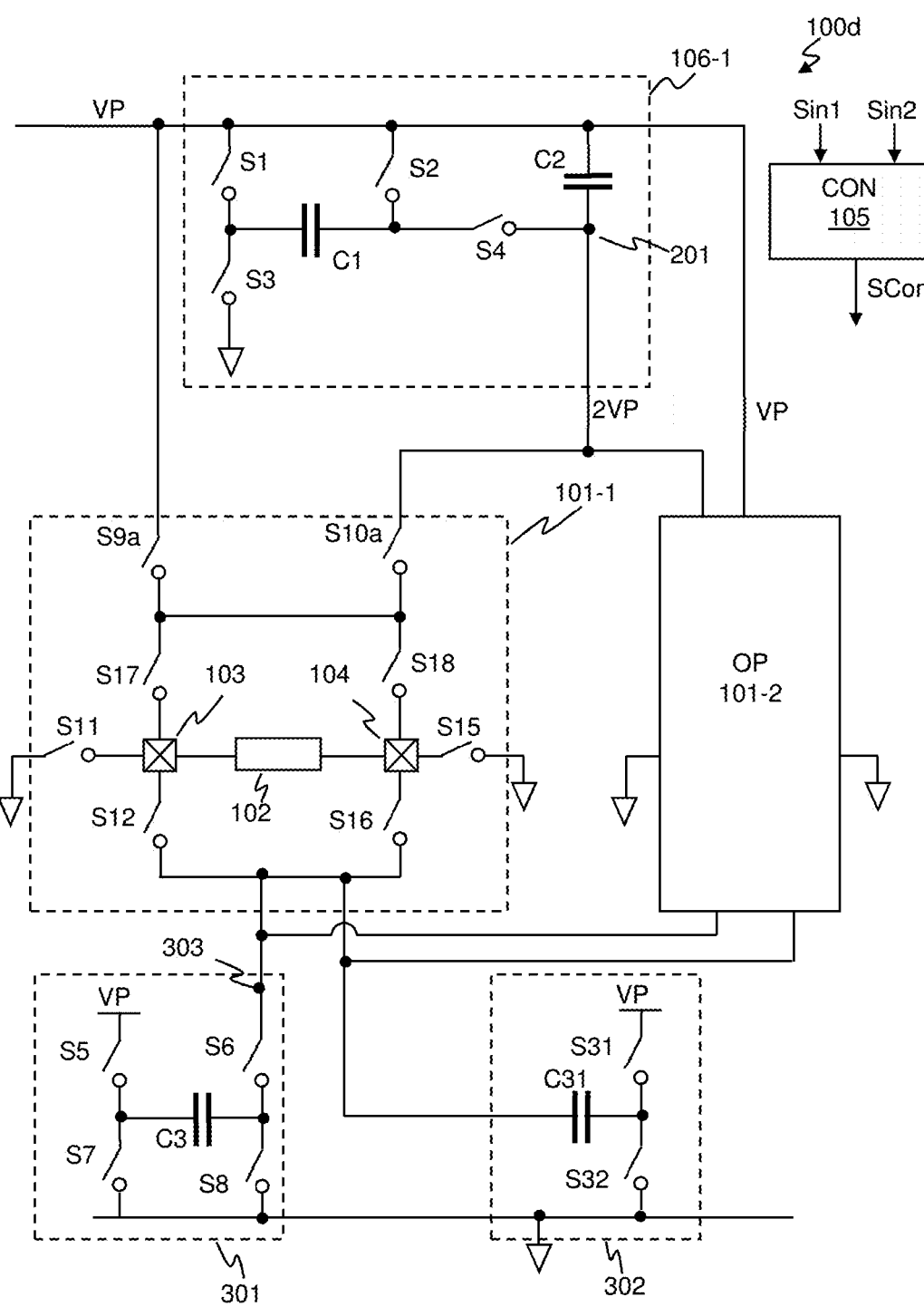
FIG. 4 illustrates one example of a multichannel switching driver with a shared flying capacitor drivers.

FIG. 4 illustrates one example of a switching driver circuit that comprises flying capacitor drivers for generating at least some of the switching voltages and which are shared between the output stages. Again similar features to those discussed with reference to the previous figures are identified by the same reference numerals.

The switching driver of FIG. 4, labelled as 100d, again comprises a plurality of output stages 101, in this example first and second output stages 101-1 and 101-2. In this example each output stage has the same structure as discussed with reference to FIGS. 2 and 3. The switching driver 100c of FIG. 3 again receives first and second supply voltages, which in this example are a positive supply voltage VP and ground. The switching driver 100c also has a first capacitive voltage generator 106-1, which is a charge pump that receives the first and second supply voltages and generates a first boosted voltage nominally equal to 2VP.

The switching driver 100d also comprises a plurality of capacitive voltage generators configured as flying capacitor drivers. In the example of FIG. 4, there are first and second flying capacitor drivers 301 and 302 for generating output voltages of –VP and –2VP respectively, which each have the same structure as discussed with reference to FIG. 3.

In the example of FIG. 4, each of the first and second flying capacitor drivers 301 and 302 is shared between the first and second output stages 101-1 and 101-2 and thus outputs of the first and second flying capacitor drivers 301 and 302 are connected to the low-side rails of each of the first and second output stages 101-1 and 101-2.

Each of the first and second output stages 101-1 and 101-2 could be operated in any of the modes discussed above with respect to FIG. 3, thus the first output stage, could, for example, be selectively controlled to operate in any of Mode 1 (with both the first and second driver output nodes 103 and 104 being modulated between the first and second supply voltages VP and 0V), Mode 2b (with one driver output node modulated between the switching voltages VP and 0V and the other driver output node modulated between 0V and –VP), Mode 3a (with one driver output node modulated between the switching voltages 2VP and VP and the other driver output node modulated between 0V and –VP), Mode 3b (with one driver output node modulated between the switching voltages VP and 0V and the other driver output node modulated between –VP and –2VP) and Mode 4 (with one driver output node modulated between the switching voltages 2VP and VP and the other driver output node modulated between –VP and –2VP).

However, the first and second flying capacitor drivers 301 and 302 only generate the relevant voltage output for part of the switching cycle and, as discussed with reference to FIG. 3, may be switched with a duty-cycle as required for one of the output stages. In the example of FIG. 4, the switching driver 100$c$ shares the first and second flying capacitor drivers 301 and 302 with the first and second output stages 101-1 and 101-2, and thus the controller 105 is configured to manage use of the first and second flying capacitor drivers 301 and 302.

If, for instance, the first output stage 101-1 is operating in a mode that doesn't use either of the output voltages –VP or –2VP of the first and second flying capacitor drivers 301 and 302 as a switching voltage, e.g. Mode 1, then the second output stage 101-2 may be operated in any of the modes discussed above based on the level of the input signal Sin2 for that channel and, if needed, (say in Mode 2b, Mode 3a, Mode 3b or Mode 4) the first and second flying capacitor drivers 301 and 302 may be switched with a duty-cycle appropriate for the second output driver 101-2.

If, however, both of the first and second output stages 101-1 and 101-2 were to be operated in a mode where one of the driver output nodes is modulated between the voltages –VP and 0V (ground), e.g. one of Mode 2b or Mode 3a, then both output stages would want to make use of the output voltage-VP from the first flying capacitor driver 301. In this case the controller 105 may be configured to determine which of the output stages 101-1 and 101-2 requires the voltage –VP for the most time in the switching cycle, which may be referred to as the dominant output stage, and control the duty-cycle of the first flying capacitor driver 301 with the correct duty-cycle for that dominant output stage. In that case, switch S12 or S16 of the dominant output stage could be closed throughout the switching cycle as discussed above, to connect the relevant driver output node to the output of the first flying capacitor driver 301 which provides the desired modulation for that output node. For the output stage which is not the dominant output stage, i.e. the non-dominant output stage, the output node 303 of the first flying capacitor driver 301 spends longer at the voltage –VP than is necessary for that output stage, and so in that case, rather than close the relevant one of switch S12 and S16 through the whole switching cycle, this switch is closed for only part of the switching cycle (when the output of the first flying capacitor driver 301 is at –VP) with a duty-cycle appropriate for that output stage, with switch S11 or S15 as appropriate being closed for the rest of the switching cycle to connect the relevant driver output node to ground.

Thus, for example, consider that both of the first and second output stages 101-1 and 101-2 are operating in Mode 3a and both are outputting output voltages of positive polarity. In this case, the second driver output node of each output stage will be modulated between –VP and ground. If the required duty-cycle for the voltage –VP (i.e. the proportion of the switching cycle spent at –VP rather than 0V) for the first output stage 101-1 is 30% and the required duty-cycle for the voltage –VP for the second output stage 101-2 is 65%, then the second output stage will be determined to be the dominant output stage. Switch S16 of the second output stage may thus be closed throughout the switching cycle and the first flying capacitor driver switched to generate –VP with a duty-cycle of 65%. For the first output stage 101-1, switch S16 will be controlled to be on for 30% of the switching cycle (to coincide with when the output of the first flying capacitor driver is at –VP) and then switch S16 may be opened and switch S15 closed for the rest of the switching cycle.

In this way both the first and second output stages can be satisfactorily provided with the required duty-cycles of –VP and 0V (ground) using the shared first capacitor driver 301.

It will, of course, be understood that which output stage is the dominant output stage may vary over time with changes in signal level.

In the case that one of the first and second output stages 101-1 and 101-2 were to be operated in a mode where one of the driver output nodes was modulated between the voltages –2VP and –VP, e.g. Mode 4, and the other of the output stages were to be operated in a mode where one of the driver output nodes was modulated between the voltages –VP and 0V (ground), e.g. one of Mode 2b or Mode 3a, then the output stage which has the driver output node modulated between –2VP and –VP would be deemed to be the dominant output stage, and the first and second flying capacitors drivers 301 and 302 controlled with a duty-cycle appropriate for the dominant output stage. Switch S12 or S16 as appropriate of the dominant output stage may be closed throughout the switching cycle to connect the relevant driver output node to the low-side rail which is modulated appropriately.

In this case, the control of the non-dominant output stage may depend on the duty-cycle of the dominant output stage and the duty-cycle demand, i.e. signal level, of the non-dominant output stage.

The duty-cycle for the dominant stage will determine the amount of time in each switching cycle that the first and second flying capacitors drivers 301 and 302 output the voltage –VP (with the output for the rest of the cycle being –2VP), i.e. the proportion of time that the low-side rail spends at –VP. The duty-cycle demand of the non-dominant stage will determine the proportion of time that the voltage –VP is required for the relevant output node (with that output node being connected to ground for the rest of the cycle). If the duty-cycle of the dominant stage is such that the low-side rail is at –VP for a sufficient amount of time to meet the demand for the non-dominant stage in the relevant mode, e.g. Mode 2b or Mode 3a, then the non-dominant stage may be operated in that mode. There would be no change to the overall duty-cycle for the non-dominant output stage, but there may be a need to apply some phase control to ensure that the periods that the relevant output node is connected to the low-side rail (via switches S12 or S16 as appropriate) coincide with periods when the low-side rail is driven to –VP by the first flying capacitor driver 301.

If however, the duty-cycle of the dominant output stage is such that the low side rail is not driven to –VP for a sufficient amount of time to meet the duty-cycle demand of the non-dominant output stage (in the relevant Mode 2b or Mode 3a), the mode of operation of the non-dominant channel could be altered, for instance so that the relevant driver output node switches between the voltages –2VP and ground, with an appropriate adjustment to duty-cycle (at least for that driver output node). For instance, rather than switch the relevant driver output node between –VP and ground with a duty-cycle of D % (in terms of the proportion of time spent at the voltage –VP), the relevant driver output node could be switched between –2VP and ground with a duty-cycle of D/2%. This would provide the same average voltage, over the course of the switching cycle, at the relevant driver output node. The other driver output node could be modulated between the relevant switching voltages without adjustment—although this may mean that the two driver output nodes are switched asymmetrically with respect to one another. Alternatively, in some cases, the duty-cycles for both of the driver output nodes of the non-dominant output stage could be adjusted by an appropriate amount, for instance by an amount D/1.5 in some cases, which may be advantageous in terms of maintaining a common-mode voltage.

Thus, for instance, rather than operate the non-dominant channel in Mode 3a, with one driver output node modulated between-VP and ground and the other driver output node modulated between 2VP and VP, the non-dominant output stage may be operated in Mode 3c, with one driver output node modulated between −2VP and ground and the other driver output node modulated between 2VP and VP, with an appropriate adjustment to duty-cycle. Likewise, instead of operating the non-dominant channel in Mode 2b, with one driver output node modulated between −VP and ground and the other driver output node modulated between VP and ground, the non-dominant channel could be operated in a different mode, which may be referred to as Mode 2c, in which one driver output node is modulated between −2VP and ground and the other driver output node is modulated between VP and ground, again with an appropriate adjustment to duty-cycle. In this case, switch S12 or S16 of the non-dominant output stage may be controlled to be closed when the low-side rail is driven to −2VP by the second flying capacitor driver 302 for a proportion of the switching cycle as determined by the appropriately adjusted duty-cycle. Switch S11 or S15 as appropriate can then be closed for the rest of the switching cycle.

In the case that both of the first and second output stages 101-1 and 101-2 were to be operated in a mode where one of the driver output nodes was modulated between the voltages −2VP and −VP, e.g. both output stages were operated in Mode 4, then the output stage that requires the voltage −2VP from the second flying capacitor driver for the greatest amount of time would be determined to be the dominant output stage, and the first and second flying capacitors drivers 301 and 302 controlled with a duty-cycle appropriate for the dominant output stage. Switch S12 or S16 as appropriate of the dominant output stage may be closed throughout the switching cycle to connect the relevant driver output node to the low-side rail which is modulated appropriately.

In this case, the relevant switch S12 or S16 of the non-dominant output stage would also be closed throughout the switching cycle so that the relevant output node of the non-dominant output stage is modulated at the same duty-cycle as the dominant output stage. To ensure the correct differential output voltage across the load for the non-dominant output channel, the duty-cycle and, in some cases, the switching voltages used for the non-dominant channel may be adjusted.

For instance, consider both the first and second output stages 101-1 and 101-2 are operating in Mode 4 and the duty cycle demand for the low-side rail for the first output stage is 65% (in terms of the proportion of the switching cycle where the voltage −2VP is required) whereas the duty cycle demand for the low-side rail for the second output-stage is 45%. In this case the first output stage 101-1 would be determined to be the dominant output stage and the first and second flying capacitor drivers 301 and 302 would be operated according to the duty cycle demand of the first output stage. However, both the first and second output stages would be connected to their respective low-side rail throughput the switching cycle and thus the relevant output node of the second (non-dominant) output stage would be connected to the voltage −2VP for 20% too long in the switching cycle. To compensate, a corresponding change in duty-cycle for the other driver node of the second output stage could be made, i.e. rather than modulate the high-side rail of the second output stage between 2VP and VP with a duty cycle of 45% (in terms of the proportion of time spent at 2VP), the duty cycle could be reduced to 25% to compensate for the additional contribution from the low side rail.

However, in some cases it may not be possible for the non-dominant output stage to be able to operate in Mode 4 and apply a sufficient change to the duty-cycle for the high-side rail. For instance, had the duty-cycle demand for the second output stage been only 30%, then the low-side rail would remain at the voltage −2VP for 35% too long, but it would not be possible to adjust the duty-cycle for the high-side rail enough.

Thus, in at least some cases, if both output stages have signal levels that would lead to operation in Mode 4, the controller 105 may determine the dominant output stage as the output stage that would have the greatest duty-cycle demand for the voltage −2VP if operating in Mode 4. That dominant output stage may be operated in Mode 4 and the first and second flying capacitor drivers 301 and 302 would be operated according to the duty cycle demand of the dominant output stage. The non-dominant output stage can be operated in a different mode, for example a mode referred to as Mode 4b, where one driver output node is switched between −2VP and −VP (with the duty-cycle that applies for the dominant output stage), and the other driver output node of the non-dominant output stage is switched between the boosted voltage 2VP and ground (rather than between 2VP and VP). This ensures that a sufficient adjustment can be made to the duty-cycle for that driver output node to compensate for the low-side rail being modulated with the duty-cycle for the dominant output stage.

In general, therefore, the controller 105 can control multiple output stages to share a flying capacitor driver which generates a switching voltage for only part of the switching cycle. The controller 105 may determine which output stage demands the relevant output voltage for the greatest proportion of the switching cycle and operate the flying capacitor driver with the duty cycle appropriate for that output stage. For the other output stages, the controller 105 may duty-cycle other switches of the relevant output stage to provide the correct duty-cycle where possible, otherwise the controller may control the relevant output stage to operate in a different mode and/or with an adjusted duty-cycle to ensure the correct output voltage. The controller 105 may, in general, be configured to operate each output stage in a preferred mode of operation for a given signal level (e.g. in Mode 4 for signal magnitudes above the third threshold), but in the event that this is not possible, to control a dominant output stage to operate in the preferred mode and control at least one of the other output stages i.e. a non-dominant output stage, to operate in an alternative mode (e.g. in Mode 4b) with an adjusted duty-cycle as necessary.

The example of FIG. 4 has illustrated just two output stages 101 but the principles can be extended to additional multiple stages. The example of FIG. 4 has also been explained with reference to a particular set of switching voltages and modes of operation but other implementations may have different modes and different switching voltages. In general the flying capacitor driver can be controlled to provide an appropriate duty-cycle for an output stage determined to be the dominant output stage and the switching and/or mode of operation of the other output stages adjusted as necessary.

The examples discussed above thus illustrate that at least one capacitive voltage generator 106 can be shared by multiple output stages of a multichannel switching driver. In some implementations, different capacitive voltage generators may be shared between different output stages.

Figure 5:
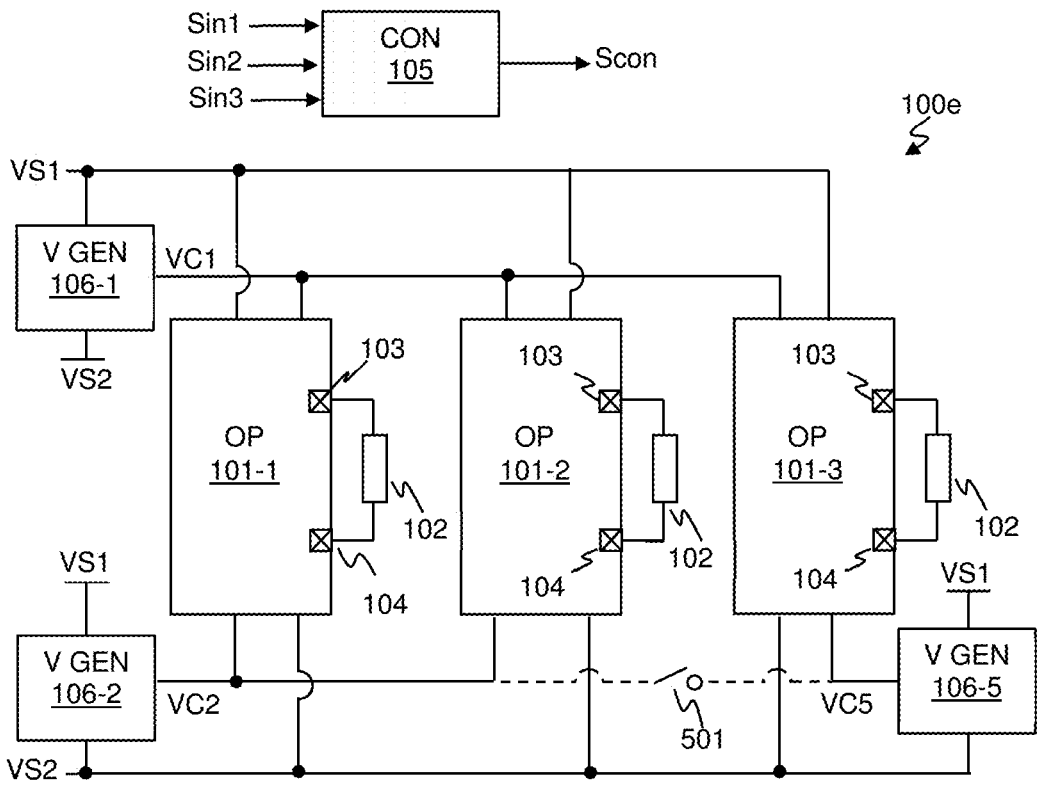
FIG. 5 illustrates generally a multichannel switching driver according to another embodiment.

For example, FIG. 5, illustrates an example of a multi-channel switching driver 100e, in which similar components as discussed previously are identified by the same reference numerals. The example of FIG. 5 again illustrates that the switching driver 100e receives first and second supply voltages VS1 and VS2, for instance a positive supply voltage and ground, and comprises a plurality of capacitive generators for generating other possible switching voltages. The example of FIG. 5 has a first capacitive voltage generator 106-1 for generating a first voltage VC1 which is different to the supply voltages and which may be, for example the first supply voltage boosted positively by the input voltage, and a second capacitive voltage generator 106-2 for generating a second voltage VC1 which is different to the supply voltages and to the voltage VC1, and which may be, for example the second supply voltage boosted negatively by the input voltage.

The example of FIG. 5 illustrates three output stages 101 and illustrates that the first capacitive voltage generator 106-1 is shared with all three output stages 101, however the second capacitive voltage generator 106-2 is configured to be shared with just two of the output stages 101-1 and 101-2. FIG. 5 illustrates another capacitor voltage generator, labelled as 106-5, may be provided to provide an output voltage VC5 to the other output stage 101-3. In some implementations the voltage VC5 generated by the capacitive voltage generator 106-5 may be the same as the voltage VC2 generated by the second capacitive voltage generator. This may enable the three output stages to be operable in the same modes as one another, but at least some of the output stages can receive the same switching voltages from different capacitive voltage generators.

For example, if the supply voltages VS1 and VS2 were a positive supply voltage VP and ground, i.e. 0V, respectively and the voltage VC1 were a positively boosted voltage of 2VP and the voltages VC2 and VC5 were the same as each other and equal to a negatively boosted voltage-VP, then each of the output stages would be operable in the various modes discussed with reference to FIG. 2. In this case, if the input signals for all three output stages were at the intermediate signal level and the output stages were operable in both Mode 2a and Mode 2b, one of the output stages 101-1 and 101-2 could be operated in Mode 2a whilst the other of the output stages 101-1 and 101-2 is operated in Mode 2b and the output stage 101-3 could also be operated in Mode 2b. Thus only one of the output stages would use the boosted voltage 2VP from the voltage generator 106-1. The other two output stages would use the boosted voltage-VP, but this voltage would be separately generated for each of the output stages by the separate capacitive voltage generators 106-2 and 106-5.

Embodiments thus allow flexibility to share capacitive voltage generator across multiple channels in a number of different ways, for instance in an irregular pattern. This allows simple and flexible trade-offs to be made between circuit area, efficiency and peak output power per channel.

In some cases the sharing may be configurable in use. For instance as illustrated in FIG. 5, optional switch 501 could be provided that could allow one or both of capacitive voltage generators 106-2 and 106-5 to be shared amongst different numbers of output stages, possibly with the other output stage being disabled. The sharing configuration for the capacitive voltage generator across the various output stages may be controlled depending on a particular application or use case and/or could be varied in use based on operating conditions. For instance, in some cases it may be desirable to disable one of the capacitive voltage generators, e.g. to reduce switching losses, if most of the channels are outputting low-level signals. However, if several of the channels are active to output intermediate level signals the benefits of increased power output and/or reduced conduction losses may justify activating that capacitive voltage generator.

It will be understood from the foregoing that where the capacitive voltage generator is a charge pump, it will generally be switched between the charging and output states at a charge pump frequency.

In some cases, if there is more than one charge pump, the switching frequency of the charge pumps, when active, may be the same as one another and the charge pumps may thus each receive a version of a common clock signal to control switching. The switching frequency of the charge pumps can be independent of the duty cycle of the output bridge stage.

In some implementations, however, the switching frequency of at least one charge pump, when active, may be different to the switching frequency of another charge pump. The switching frequency of each charge pump may be set to be sufficient to maintain the output voltage of that charge pump, given the expected loading and/or the switched frequency may be varied in use based, e.g. based on an indication of loading.

In some implementations, at least one charge pump may not be actively switched at the relevant charge pump frequency if the relevant boosted voltage is not being used as one of the switching voltages, so as to save power, e.g. in switching losses. For instance, referring back to FIG. 2, if all output stages of the switching driver 100a are operating in Mode 1, with both the first and second output nodes 103 and 104 of the output stage being switching between the first and second supply voltages, the first and second boosted voltages are not used as switching voltages. In this case, at least one of the first and second charge pumps 106-1 and 106-2 may be inactive or may operate in only a relatively minimal manner to maintain an acceptable level of charge on the relevant hold capacitor. For instance, the charge pump could be operated at a relatively low frequency which is, for example, just sufficient to recharge the hold capacitor to account for leakage. In some examples, a control loop (e.g. of controller 105) could monitor the voltage at the output node of the relevant charge pump and only operate the charge pump to recharge the hold capacitor if the voltage at the output droops by more than a defined amount. This may keep the relevant hold capacitor substantially charged, so that the charge pump can be activated quickly, when required to provide one of the switching voltages in one of the other operating modes. Additionally or alternatively, the relevant charge pump could be activated just before it will be needed for operation in a particular mode, based on some look ahead of the signal, with the charge pump being activated with sufficient time for the relevant hold capacitor to become fully charged before the output is used as one of the switching voltages. In some examples the charge pump switching frequency of at least one charge pump, e.g. 106-1 or 106-2 could also be variable based on a look ahead signal indicative of the input signal level so that the charge pump is operated at a frequency which is sufficient to keep the relevant hold capacitor sufficiently charged given the anticipated load demand.

The controller 105 may thus, in some embodiments, also control activation of and/or the switching frequency of at least one charge pump. As noted above this can improve power efficiency, e.g. through reduced switching losses.

Figure 6:
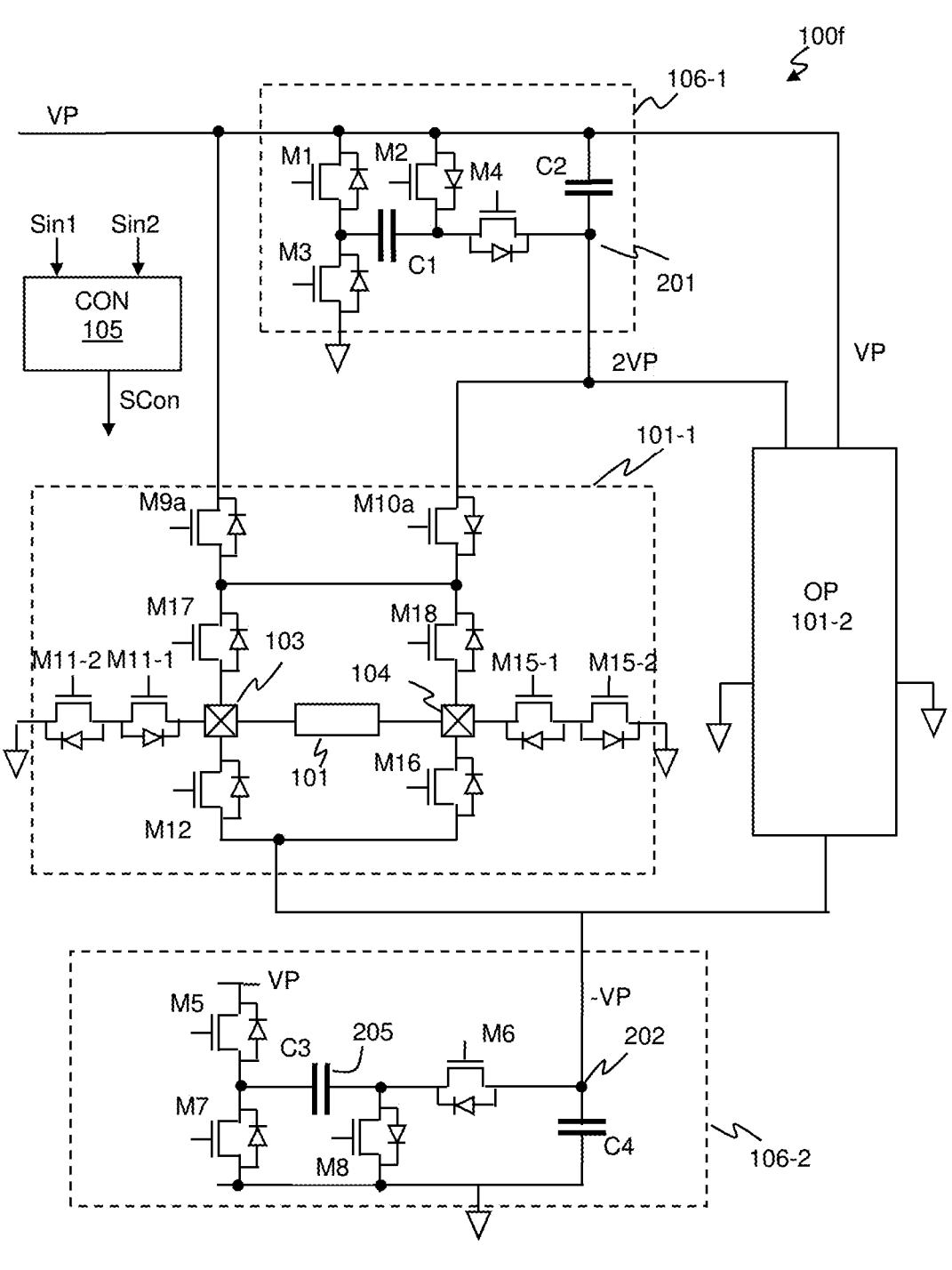
FIG. 6 illustrates one possible example of an implementation of another example of a switching driver.

Each of the switches of the switching driver 100 according to embodiments of the disclosure may be implemented by one or more suitable transistors, for instance by one or more MOS transistors as would be understood by one skilled in the art. FIG. 6 illustrates one example of how a switching driver 100$f$ could be implemented. In the example of FIG. 6, the switching driver 100$f$ comprises first and second charge pumps 106-1 and 106-2 such as described with respect to FIG. 2, and has an output stage 101 such as described with reference to FIG. 3$b$ or 4. Each of the switches S1-S4 of the first charge pump 106-1 and switches S5-S8 of the second charge pump 106-2 can be implemented by a suitable MOS transistor, indicated as M1-M8 respectively. FIG. 6 also shows that, as would be understood by one skilled in the art, each MOS transistor may have an associated body diode and the transistors are arranged to avoid unwanted conduction via the body diode when in the off state. The maximum voltage across any of the transistors M1 to M8 in normal operation will be equal to the input voltage VP.

Switches S9$a$, S10$a$, S12, S16, S17 and S18 of each output stage can each also be implemented by a suitable MOS transistor, M9$a$, M10$a$, M12, M16, M17 or M18 respectively. The body diodes of transistors M9$a$ and M10$a$ are arranged in opposite orientations with respect to the high-side rail so that when transistor M9$a$ is on and M10$a$ is off, and the high-side rail is at VP, the body diode of M10 is reversed biased with respect the 2VP voltage at the output of the first charge pump and that when transistor M10$a$ is on and M9$a$ off, and the high-side rail is at 2VP, the body diode of M10$a$ is reversed biased with respect the 2VP voltage at the high side rail. Switch S11 is, in this example, implemented by a pair of transistors, M11-1 and M11-2, with the body diodes in opposite orientations to one another, i.e. in a back-to-back arrangement, so that, when switch S11 is off at least of the body diodes is reverse biased whether the output node 103 is connected to a positive voltage at the high-side rail or to a negative voltage at the low-side rail. Likewise switch S15 is implemented by a pair of back-to-back transistors M15-1 and M15-2.

The other embodiments described herein could be implemented in similar ways.

The embodiments above have been discussed with reference to first and second supply voltages of a positive supply VP and ground. It will be understood that this is just one example however and the first and second supply voltages could both be non-zero voltages and/or at least one of the supply voltages could be a negative polarity supply.

The embodiments have also been described with the capacitive voltage generators being arranged for boosting or step-up generation, but as noted above, one or more of the capacitive voltage generators could be configured for a step-down or buck operation.

The multichannel driver apparatus of embodiments of the disclosure may be suitable for driving multiple output transducers in different channels. At least one of the output transducers may, in some implementations, be an audio output transducer such as a loudspeaker or the like. The output transducer may be a haptic output transducer. In some implementations the output transducer may be driven in series with an inductor, i.e. there may be an inductor in an output path between an output node of the switching driver and the load. In some implementations the transducer may be a piezoelectric or ceramic transducer.

Embodiments may be implemented as an integrated circuit. Embodiments may be implemented in a host device, especially a portable and/or battery powered host device such as a mobile computing device for example a laptop, notebook or tablet computer, or a mobile communication device such as a mobile telephone, for example a smartphone. The device could be a wearable device such as a smartwatch. The host device could be a games console, a remote-control device, a home automation controller or a domestic appliance, a toy, a machine such as a robot, an audio player, a video player. It will be understood that embodiments may be implemented as part of a system provided in a home appliance or in a vehicle or interactive display. There is further provided a host device incorporating the above-described embodiments.

The skilled person will recognise that some aspects of the above-described apparatus and methods, for instance aspects of controlling the switching control signals to implement the different modes, may be embodied as processor control code, for example on a non-volatile carrier medium such as a disk, CD- or DVD-ROM, programmed memory such as read only memory (Firmware), or on a data carrier such as an optical or electrical signal carrier. For some applications, embodiments may be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112 (f) unless the words "means for" or "step for" are explicitly used in the particular claim.

The invention claimed is:

1. A multichannel driver apparatus for driving a plurality of transducers in different channels based on respective input signals, comprising:

a plurality of output stages, each output stage comprising at least one driver output node for connection to a respective one of the plurality of transducers, wherein each output stage is configured such that the at least one driver output node can be modulated between selected switching voltages with a controlled duty cycle, and wherein each output stage is operable in a plurality of different modes of operation in which the switching voltages are different in the different modes;

at least one shared voltage generator for outputting a first generated voltage for use as a switching voltage by a first set of two or more of said plurality of output stages; and a controller configured to control the mode of operation and duty-cycle of each of the plurality of output stages based on a respective input signal, wherein the controller is configured to further control the mode of operation and/or duty-cycle of each of the output stages of the first set based on operation of the other output stages of the first set.

2. The multichannel driver apparatus of claim 1 wherein the controller is configured to control the mode of operation of each of the output stages of the first set so as to limit the number of output stages that use a first generated voltage output by the shared voltage generator as a switching voltage at the same time.

3. The multichannel driver apparatus of claim 1 wherein each of the output stages of the first set is operable in at least first and second modes for a defined range of magnitude of the input signal for that output stage, wherein the first mode uses a first generated voltage output by a first capacitive voltage generator as a switching voltage and the second mode does not use the first generated voltage output by the first capacitive voltage generator as a switching voltage, and wherein the controller is configured such that if the respective input signals for two or more output stages of the first set have magnitudes in the defined range, the controller controls at least one of said two or more output stages to operate in said second mode.

4. The multichannel driver apparatus of claim 3 wherein, if the respective input signals for two output stages of the first set have magnitudes in the defined range, the controller controls at least one of said two or more output stages to operate in said first mode and the other of said two or more output stages to operate in the second mode.

5. The multichannel driver apparatus of claim 3 further comprising:

a second shared voltage generator for outputting a second generated voltage, different to the first generated voltage;

wherein each of the output stages of the first set is configured to use the second generated voltage from one of the at least one further shared voltage generators as a switching voltage in said second mode.

6. The multichannel driver apparatus of claim 5 wherein:

a second set of two or more of the plurality of output stage are configured to receive the second generated voltage from the second shared voltage generator for use as a switching voltage; and the controller is further configured to control the mode of operation of each of the output stages of the second set so as to limit the number of output stages that use the second generated voltage output by the second shared voltage generator as a switching voltage at the same time.

7. The multichannel driver apparatus of claim 6 wherein the first set of output stages and the second set of output stages are the same as one another.

8. The multichannel driver apparatus of claim 1 wherein a first shared voltage generator comprises a capacitive voltage generator.

9. The multichannel driver apparatus of claim 8 wherein the capacitive voltage generator comprises a charge pump with connections for at least one hold capacitor to maintain the first generated voltage at an output of the charge pump throughout a switching cycle of the charge pump.

10. The multichannel driver apparatus of claim 8 wherein the capacitive voltage generator comprises a flying capacitor driver which is operable in switching cycle of different switch states, in which the first generated voltage is only present at an output of the flying capacitor driver for part of the switching cycle with a controlled duty-cycle.

11. A multichannel driver apparatus for driving a plurality of transducers in different channels based on respective input signals, comprising:

a plurality of output stages, each output stage comprising at least one driver output node for connection to a respective one of the plurality of transducers, wherein each output stage is configured such that the at least one driver output node can be modulated between selected switching voltages with a controlled duty cycle, and wherein each output stage is operable in a plurality of different modes of operation in which the switching voltages are different in the different modes; and wherein a first set of two or more of said plurality of output stages is configured to be operable to use a first voltage which is generated at a first voltage node as one of the switching voltages; and a controller configured to control the mode of operation and duty-cycle of each of the plurality of output stages based on a respective input signal, wherein the controller is configured to further control the mode of operation and/or duty-cycle of each of the output stages of the first set based on operation of the other output stages of the first set.

12. The multichannel driver apparatus of claim 11 wherein the controller is configured to control the mode of operation of each of the output stages of the first set so as to limit the number of output stages that use the first voltage as a switching voltage at the same time.

13. The multichannel driver apparatus of claim 11 wherein each of the output stages of the first set is operable in at least first and second modes for a defined range of magnitude of the input signal for that output stage, wherein the first mode uses the first voltage as a switching voltage and the second mode does not use the first voltage as a switching voltage, and wherein the controller is configured such that if the respective input signals for two or more output stages of the first set have magnitudes in the defined range, the controller controls at least one of said two or more output stages to operate in said second mode.

14. The multichannel driver apparatus of claim 13 wherein, if the respective input signals for two output stages of the first set have magnitudes in the defined range, the controller controls at least one of said two or more output stages to operate in said first mode and the other of said two or more output stages to operate in the second mode.

15. The multichannel driver apparatus of claim 13 wherein:

each of the output stages of the first set is further configured to be operable to use a second voltage which is generated at a second voltage node as one of the switching voltages; and each of the output stages of a second set is configured to use said second voltage as a switching voltage in said second mode.

16. The multichannel driver apparatus of claim 15 wherein:

the controller is further configured to control the mode of operation of each of the output stages of the second set so as to limit the number of output stages that use the second voltage as a switching voltage at the same time.

17. The multichannel driver apparatus of claim 11 wherein the first voltage is generated at the first voltage node by a capacitive voltage generator.

18. A driver apparatus for driving a transducer based on an input signal, comprising:

a first output stage comprising at least one driver output node for connection to said transducer, and a controller for controlling the first output stage to modulate the at least one driver output node between selected switching voltages of a set of switching voltages with a controlled duty cycle, wherein the controller is configured to selectively operate the first output stage in a selected one of a plurality of different modes of operation in which the selected switching voltages are different in the different modes;

wherein at least a first switching voltage of the set of switching voltages is generated by a first voltage generator; and wherein the controller is configured to identify first periods in which use of the first switching voltage should be avoided due to other load demands of the first voltage generator and is configured to control the mode of operation and/or duty-cycle of the first output stage to avoid using the first switching voltage as a selected switching voltage in said first periods.

19. The driver apparatus of claim 18 wherein said first periods correspond to periods in which the first switching voltage is being used as a selected switching voltage by another driver output stage.

20. The driver apparatus of claim 18 wherein said first periods correspond to periods in a switching cycle of the first output stage in which the first switching voltage is not generated.

* * * * *